(12) United States Patent
Cavers et al.

(10) Patent No.: US 7,084,703 B2
(45) Date of Patent: Aug. 1, 2006

(54) SELF-CALIBRATED POWER AMPLIFIER LINEARIZERS

(75) Inventors: James K. Cavers, Richmond (CA); Thomas Johnson, Delta (CA)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 11/010,710

(22) Filed: Dec. 13, 2004

(65) Prior Publication Data

US 2005/0116776 A1 Jun. 2, 2005

Related U.S. Application Data

(60) Continuation of application No. 10/780,628, filed on Feb. 19, 2004, now Pat. No. 6,831,512, which is a division of application No. 09/982,628, filed on Oct. 18, 2001, now Pat. No. 6,734,731.

(60) Provisional application No. 60/301,978, filed on Jun. 28, 2001.

(51) Int. Cl.
*H03F 1/26* (2006.01)
(52) U.S. Cl. .............................. 330/149; 330/2; 330/52
(58) Field of Classification Search ................ 330/149, 330/2, 52
See application file for complete search history.

(56) References Cited

U.S. PATENT DOCUMENTS

| | | | |
|---|---|---|---|
| 4,379,994 A | 4/1983 | Baumann | 330/149 |
| 4,879,519 A | 11/1989 | Myer | 330/149 |
| 5,130,633 A | 7/1992 | Tattersall, Jr. | 330/52 |
| 5,157,345 A | 10/1992 | Kenington et al. | 330/149 |
| 5,307,022 A | 4/1994 | Tattersall, Jr. et al. | 330/52 |
| 5,485,120 A | 1/1996 | Anvari | 330/151 |
| 5,489,875 A | 2/1996 | Cavers | 330/151 |
| 5,532,642 A | 7/1996 | Takai | 330/15 |
| 5,565,814 A | 10/1996 | Fukuchi | 330/52 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,644,268 A | 7/1997 | Hang | 330/151 |
| 5,694,395 A | 12/1997 | Myer et al. | 370/480 |
| 5,742,201 A | 4/1998 | Eisenberg et al. | 330/2 |
| 5,760,646 A | 6/1998 | Belcher et al. | 330/149 |
| 5,789,976 A | 8/1998 | Ghannouchi et al. | 330/52 |
| 5,815,036 A | 9/1998 | Yoshikawa et al. | 330/52 |
| 5,831,478 A | 11/1998 | Long | 330/52 |
| 5,862,459 A | 1/1999 | Charas | 455/144 |
| 5,867,065 A * | 2/1999 | Leyendecker | 330/149 |
| 5,898,339 A | 4/1999 | Maruyama et al. | 330/151 |

(Continued)

FOREIGN PATENT DOCUMENTS

| | | |
|---|---|---|
| EP | 0675594 | 10/1995 |
| JP | 58 175309 | 10/1983 |

OTHER PUBLICATIONS

F. Amoroso, *Spectral Containment by Predistortion of OQPSK Signal*, Oct. 1998.

(Continued)

*Primary Examiner*—Khanh V. Nguyen
(74) *Attorney, Agent, or Firm*—Wood, Herron & Evans, LLP

(57) ABSTRACT

An amplifier linearizer includes a signal adjuster having an internal signal, and an adaptation controller for monitoring the signal adjuster. The internal signal at an input to the adaptation controller is deemed a monitor signal. The adaptation controller generates a control signal for the signal adjuster by accounting for a difference between the internal and monitor signals.

19 Claims, 14 Drawing Sheets

U.S. PATENT DOCUMENTS

| | | | | |
|---|---|---|---|---|
| 6,075,411 | A | 6/2000 | Briffa et al. | 330/149 |
| 6,166,601 | A | 12/2000 | Shalom et al. | 330/151 |
| 6,208,207 | B1 | 3/2001 | Cavers | 330/149 |
| 6,414,546 | B1 * | 7/2002 | Cavers | 330/149 |

OTHER PUBLICATIONS

J.K. Cavers, *Convergence Behavior of an Adaptive Feedforward Linearizer*, IEEE Vehicular Technology Conference (1994).

J. Cavers, *Adaption Behavior of a Feedforward Amplifier Linearizer*, Feb. 1995.

J. Chao, H. Perez, and S. Tsujii, *A Fast Adaptive Filter Algorithm Using Elgenvalue Reciprocals as Step sizes*, IEEE Transactions on Acoustics, Speech, and Signal Processing, vol. ASSP-38, No. 8 (Aug. 1990).

J. Chen et al., *Adaptive Joint Linearisation/Equalisation with Delay Alignments for a Wideband Power Amplifier*, Mar. 1998.

J. T. Chen, H.S. Tsai and Y.K. Chen, *Fast Adaptive Wideband Power Amplifier Feed-Forward Linearizer*, IEEE Vehicular Technology Conference, Ottawa, 1998.

Q. Cheng et al., *A 1.9 GHZ Adaptive Feedforward Power Amplifier*, Nov. 1998.

G.A. Clark, S.K. Mitra, and S.R. Parker, *Block Implementation of Adaptive Digital Filters*, IEEE Transactions on Acoustics, Speech, and Signal Processing, vol. ASSP-29, No. 3, (Jun. 1983).

G.A. Clark, S.R. Parker, and S.K. Mitra, *A Unified Approach to Time-and-Frequency Domain Realization of FIR Adaptive Digital Filters*, IEEE Transactions on Acoustics, Speech, and Signal Processing, vol. ASSP-31, No. 5 (Oct. 1983).

S.J. Elliot and B. Fafaely, *Rapid Frequency—Domain Adaptation of Causal FIR Filters*, IEEE Signal Processing Letters, vol. 4, No. 12 (Dec. 1997).

E. Eweda and O. Macchi, *Convergence of the RLS and LMS Adaptive Filters*, IEEE Transactions on Circuits and Systems, vol. CAS-34, No. 7 (Jul. 1987).

A. Feuer, *Performance analysis of the Block Least Mean Square Algorithm*, IEEE Transactions on Circuits and Systems, vol. CAS-32, No. 9 (Jul. 1985).

S. Grant and J. Cavers, *A Controlled Adaptive Feedforward Amplifier Linearizer*, ICUPC, 1996.

S. Grant, *A DSP Controlled Adaptive Feedforward Amplifier Linearizer*, Jul., 1996.

R.M. Gray, *On the Asymptotic Eigenvalue Distribution of Toeplitz Matrices*, IEEE Transactions on Information Theory, vol. IT-18, No. 6 (Nov. 1972).

Hau et al., *Design and Characterization of a Microwave Feed-Forward Amplifier with Improved Wide-Band Distortion Cancellation*, IEEE Transactions on Microwave Theory and Techniques, vol. 49, Issue 1, Jan. 2001, pp. 200-203.

L.L. Horowitz and K.D. Seene, *Performance Advantage of Complex LMS for Controlling Narrow-band Adaptive Arrays*, IEEE Transactions on Acoustics, Speech, and Signal Processing, vol. ASSP-29, No. 3 (Jun. 1981).

M. Johansson and L. Sundstrom, *Linearization of RF Multicarrier Amplifiers using Cartesian Feedback*, Electronic Letters, vol. 30, No. 14 (Jul. 7, 1994).

P.B. Kenington and D.W. Bennett, *Linear Distortion Correction using Feed-forward System*, IEEE Transactions on Vehicular Technology, vol. 45, No. 1 (Feb. 1996).

J.C. Lagarias et al., *Convergence Properties of the Nedler-Mead Simplex Algorithm in Low Dimensions*, SAIM J. Optim, May 1997.

L. Ljung and L. Ljung, *Error Propagation Properties of Recursive Least-squares Adaptation, Algorithms*, Automatica, vol. 21, No. 2 (1985).

F.T. Luk and S. Qiao, *Analysis of a Recursive Least-squares Signal Processing Algorithm*, Society for Industrial and Applied Mathematics, vol. 10, No. 3 (May 1989).

S.S. Narayan, A.M. Peterson, M.J. Narasimha, *Transform Domain LMS Algorithm*, IEEE Transactions on Acoustics, Speech, and Signal Processing, vol. ASSP-31, No. 3 (Jun. 1983).

G. Panda, B. Mulgrew, C.F.N. Cowan, P.M. Grant, *A Self-Orthogonalizing Efficient Block Adaptive Filter*, IEEE Transactions on Acoustics, Speech, and Signal Processing, vol. ASSP-34, No. 6 (Dec. 1986).

D.H. Shi and F. Kozin, *On Almost Sure Convergence of Adaptive Algorithms*, IEEE Transactions on Automatic Control, vol. AC-31, No. 5 (May 1986).

A. Smith and J. Cavers, *A Wideband Architecture for Adaptive Feedforward Linearization*, May 18, 1998.

A. Smith, *A Wideband Adaptive Feedforward Amplifier Lineariser*, Aug. 1997.

* cited by examiner

US 7,084,703 B2

SELF-CALIBRATED POWER AMPLIFIER LINEARIZERS

CROSS-REFERENCE TO RELATED APPLICATIONS

This application is a Continuation of U.S. patent application Ser. No. 10/780,628 filed on Feb. 19, 2004, now U.S. Pat. No. 6,831,512 which in turn is a Divisional of U.S. patent application Ser. No. 09/982,628 filed on Oct. 18, 2001 and issued as U.S. Pat. No. 6,734,731, which claims priority to U.S. Patent Application No. 60/301,978, filed on Jun. 28, 2001, the entire disclosure of each application and patent being incorporated herein by reference.

FIELD OF THE INVENTION

This application generally pertains to, but is not limited to, linearizers used in power amplifiers, for example, RF power amplifiers used in wireless communication systems.

BACKGROUND OF THE INVENTION

RF power amplifiers, like most amplifiers, are substantially linear at small signal amplitudes. However, it is preferable to drive power amplifiers near saturation to deliver significant output power at a reasonable efficiency. As the operation of a power amplifier approaches saturation, it will become more nonlinear, and thus, exhibit more distortion in its output. Consequently, numerous "linearizer" circuits have been developed over the years in an attempt to remove the power amplifier's nonlinearity and thereby reduce the distortion in its output. Because the characteristics of the power amplifier may change over time and frequency, these linearizer circuits may be designed to adapt to present amplifier conditions. A generic power amplifier linearizer is shown in FIG. 1, and uses either predistortion circuitry, feedforward circuitry, or a combination of both, to correct for the power amplifier's nonlinearity. (The inclusion of this generic linearizer in this Background Section is not intended to imply that the circuit configuration shown therein, and variations thereof, are in the prior art.)

For example, a linearizer may use only a predistortion adjuster circuit p. As will be appreciated by those skilled in the art, in this linearizer the signal adjuster circuit s is merely a delay line ideally matching the total delay of the adjuster circuit p and the power amplifier. In this case, the distortion cancellation circuit, comprising the distortion adjuster circuit d, the error amplifier and the delay circuit, is not used—the output of the linearizer is the output of the signal power amplifier. The goal of the adjuster circuits is to predistort the power amplifier input signal so that the power amplifier output signal is proportional to the input signal of the linearizer. That is, the predistorter acts as a filter having a transfer characteristic which is the inverse of that of the power amplifier, except for a complex constant (i.e., a constant gain and phase). Because of their serial configuration, the resultant transfer characteristic of the predistorter and the power amplifier is, ideally, a constant gain and phase that depends on neither frequency nor signal level. Consequently, the output signal will be the input signal amplified by the constant gain and out of phase by a constant amount, that is, linear. Therefore, to implement such predistortion linearizers, the transfer characteristic of the power amplifier is computed and a predistortion filter having the inverse of that transfer characteristic is constructed. Preferably, the predistortion filter should also compensate for changes in the transfer function of the power amplifier, such as those caused by degraded power amplifier components.

Other linearizers use feedforward circuitry to correct for the nonlinearity in the power amplifier. A feedforward linearizer usually uses a combination of signal adjuster circuit s 110 and distortion adjuster circuit d 111 as configured in FIG. 1 (in this linearizer, predistortion adjuster p 109 is not used). In an alternative configuration, the signal adjuster circuit may be placed before the power amplifier, i.e., as adjuster circuit p 109, an example of which is shown in FIG. 7. This latter configuration advantageously compensates for any additional signal distortion caused by the signal adjuster circuit, since it will be superimposed upon the distortion caused by the power amplifier and be removed by a distortion cancellation circuit. Further, adjusters p 109, s 110, and d 111 may be used simultaneously to linearize the power amplifier.

As shown in FIG. 1, a feedforward linearizer comprises two main circuits: a signal cancellation circuit 101 and a distortion cancellation circuit 102. The RF signal is input to the signal power amplifier 103, which as discussed above, is assumed to be operating in a non-linear range and thus distorting the output signal. The signal cancellation circuit 101 ideally subtracts a linear estimate of the RF signal from the distorted power amplifier output signal so that only the nonlinear distortion signal (or "error signal") ($v_e$) remains. As will be appreciated to those skilled in the art, the signal pickoff points, the adder 104, and the subtractors 106 and 107 shown in FIG. 1 and other figures may be implemented by directional couplers, splitters or combiners, as appropriate. In the distortion cancellation circuit 102, the distortion signal is adjusted and amplified by error amplifier 108 to match the distortion signal component of the power amplifier output signal delayed by delay 112. The amplified distortion signal is then subtracted from the output of delay 112 by subtractor 107 to provide the linearizer output signal $v_o$. The linearizer output signal is a substantially distortion-free amplified RF signal, the output that would have been obtained if the power amplifier were truly linear.

Generally, the adjuster circuits discussed above do not necessarily all have the same structure—adjuster circuits p 109, s 110 and d 111 may all be implemented with different circuitry. For example, the adjuster circuit p 109 may be a nonlinear polynomial filter, while the adjuster circuits s 110 and d 111 may be finite impulse response (FIR) filters. In addition, some methods of controlling these adjuster circuits may employ pilot (tone) signals generated by an optional pilot signal generator 113.

The relationship of the input and output signals of an adjuster circuit depends on the settings of one or more parameters of that adjuster circuit, as will be discussed in further detail below. During adaptation, the values of one or more internal signals of an adjuster circuit are used to determine appropriate settings for its parameters. As shown in FIG. 1, an "adaptation controller" 114 monitors the error and output signals $v_e$ and $v_o$, and in some cases, the internal adjuster signals. (In FIG. 1 and other figures, a stroke on an arrow denotes a multiplicity of signals or a multiplicity of parameters, as the case may be.) On the basis of the monitored signal values, and in accordance with the adaptation algorithm, the adaptation controller sets the adjuster circuit parameters.

For example, a three-branch adaptive polynomial predistortion adjuster circuit p 109 is shown in FIG. 2. The upper branch 200 is linear, while the middle branch has a nonlinear cubic polynomial filter 201 and the lower branch has a nonlinear quintic polynomial filter 202, the implementation of which nonlinear filters is well known to those skilled in the art. Each branch also has a complex gain adjuster ("CGA"), respectively 203, 204, and 205, to adjust the amplitude and phase of the signal as it passes therethrough. By setting the parameters (GA, GB) of each of the CGAs, a polynomial relationship between the input and output of the adjuster circuit can be established to compensate for a memoryless nonlinearity in the power amplifier. The adaptation controller, via a known adaptation algorithm, uses the input signal, the output of the nonlinear cubic polynomial filter, the output of the nonlinear quintic polynomial filter, and the error signal (the power amplifier output signal minus an appropriately delayed version of input signal) to generate the parameters (GA, GB) for the three CGAs. Generally, the adaptation algorithm is selected to minimize a certain parameter related to the error signal (for example, its power over a predetermined time interval). Examples of such adaptation algorithms are described in more detail below.

Two possible CGA implementations are respectively shown in FIGS. 3A and 3B. The implementation shown in FIG. 3A uses polar control parameters GA and GB, where GA sets the amplitude of the attenuator 301, while GB sets the phase of the phase shifter 302. The implementation shown in FIG. 3B uses Cartesian control parameters, also designated GA and GB, where GA sets the real part of the complex gain, while GB sets the imaginary part of the complex gain. In this implementation, the input signal I is split into two signals by splitter 306, one of which is then phase-shifted by 90 degrees by phase shifter 303, while the other is not. After GA and GB are applied by mixers or attenuators 305 and 304 respectively, the signals are summed by combiner 307 to produce the CGA output signal O. U.S. Pat. No. 6,208,207 describes, in part, the linearization of these mixers and attenuators, so that desired values of complex gain can be predictably obtained by appropriate setting of the control voltages GA and GB.

For example, a three-branch adjuster circuit s 110 and a three-branch adjuster circuit d 111 in a feedforward linearizer are shown in FIG. 4. Feedforward linearizers having one or more branches in the adjuster circuits are described in U.S. Pat. Nos. 5,489,875 and 6,208,207, both of which are incorporated herein by reference. Each branch within the circuits 110 and 111, labeled "FIR adjuster", includes a delay element (i.e., delays 401, 403 and 405 in the adjuster s 110, and delays 407, 409, and 411 in adjuster d 111) and a CGA (i.e., CGAs 402, 404 and 406 in the adjuster s 110, and CGAs 408, 410, and 412 in adjuster d 111). The delays in each branch may be different, and the sum of the parallel branches act as an analog FIR filter (also known as an analog transversal filter).

Appropriate settings of the parameters (GA, GB) of the CGAs allow the first FIR adjuster circuit 110 to mimic the linear portion of the power amplifier response, including the effects of amplifier delay and other filtering, and for frequency dependence of its own components. Ideally, the amplifier nonlinear distortion is revealed at the output of the subtractor following the first FIR adjuster circuit ($v_e$). Appropriate settings of the parameters (GA, GB) of the second FIR adjuster circuit 111 allow it to compensate for delay and other filtering effects in the amplifier output path and for frequency dependence in its own components, and to subtract a replica of the nonlinear distortion from the delayed amplifier output. The adaptation controller 114 of FIG. 4, via a known adaptation algorithm, uses the internal signals of the branches of the signal and distortion adjuster circuits s 110 and d 111 and their respective error signals $v_e$ and $v_o$, to compute GA and GB for each of the CGAs in the signal and distortion adjuster circuits 110 and 111. In this fashion, the linearization circuit compensates for an amplifier nonlinearity with memory. Examples of such adaptation controllers can be found in U.S. Pat. Nos. 5,489,875 and 6,208,207.

The linearizer circuits of the prior art, however, ignore a phenomenon that often determines the success or failure of the adaptation controller—the monitored signals, as measured by the adaptation controller, are not necessarily equal to their counterpart internal signals within the adjuster circuits, or to the actual error and output signals $v_e$ and $v_o$, as the case may be. The reason is that the cables, circuit board traces, and other components in the signal paths that convey the internal adjuster circuit signals, or the error and output signals $v_e$ and $v_o$, to the adaptation controller introduce inadvertent phase and amplitude changes into those signals. The true situation is represented in FIGS. 6 and 8, where these phase and amplitude changes are generically modeled as "observation filters" (601–603, 804, 805). In addition, $H_p(f)$ 601, $H_s(f)$ 602 and $H_d(f)$ 603 may each be considered to comprise a bank of "observation subfilters," such as $h_{p1}(f)$, $h_{p2}(f)$, etc., each observation subfilter modeling the transformation of a particular internal signal of an adjuster circuit into a corresponding monitor signal (for example, one observation subfilter per branch of a multi-branch adjuster). The characteristics of these observation filters or subfilters are initially unknown.

In the simplest case, the observation filters or subfilters may represent fixed amplitude and phase changes on each of the signal paths. In a more complex case, however, the amplitude and phase changes, and thus the observation filters, can be frequency-dependent. For example, a three-branch signal adjuster p 109 located in front of the power amplifier 103 is shown in FIG. 7. This adjuster circuit is constructed so that each branch k (k=0, 1, 2) contains a frequency-dependent filter $g_k(f)$ (701, 703 or 705), which serves as a generalization of the delay elements of an FIR adjuster, and a CGA (702, 704 or 706). (The mention of these general branch filters $g_k(f)$ in this Background Section is not intended to imply that their use in FIR adjuster circuits is known in the prior art; rather, such use is intended to be within the scope of the present invention.) Each observation subfilter $h_k(f)$ (707, 708 or 709) of observation filter $H_p(f)$ 601 models the transformation of the internal signal on branch k into the corresponding monitor signal used by the adaptation controller.

It should be understood that placement of filters (or filter banks) as shown in FIG. 6 is just one of many ways to model the difference (inequality) between the internal signals and the monitor signals. Nevertheless, the observation filters shown in FIG. 6 are sufficient, because other ways of modeling the difference between internal signals and their corresponding monitor signals are equivalent to the representation thereto. For example, FIG. 8 shows a linearizer circuit that includes an observation filter $h_{em}(f)$ 804 in the path of the error signal $v_e$ output from the first subtractor 106, and an observation filter $h_{om}(f)$ 805 in the path of the RF output signal $v_o$, output from the second subtractor 107, to the adaptation controller 114. These observation filters can be transformed to the representation shown in FIG. 6 by including the effect of $h_{em}(f)$ 804 in the branch paths of adjuster circuits p 109 and s 110, and of $h_{om}(f)$ 805 into the branch path of adjuster circuit d 111 and the distortion cancellation circuit reference branch.

The severity of the problem caused by the differences between the internal adjuster signals and their corresponding monitor signals can be illustrated by a simple example. FIG. 9 illustrates the signal cancellation circuit 101 of a single-branch feedforward linearizer. Specifically, the signal adjuster circuit s 110 includes a single delay 901 followed by a CGA 902. The adaptation controller 114 uses a known "stochastic gradient" algorithm (see, for example, the gradient adaptation controller disclosed in U.S. Pat. No. 5,489, 875) to correlate using bandpass correlator 903 the error signal at the output of the subtractor with the monitored replica of the internal signal of the adjuster circuit, both of which are bandpass signals. The controller integrates the result using integrator 905, via loop gain amplifier 904, to provide CGA parameters GA and GB. The internal structure of a known bandpass correlator is depicted in FIG. 10, and includes a phase shifter 1001, mixers 1002 and 1003, and bandpass filters (or integrators) 1004 and 1005 (for a description of the operation of such a bandpass correlator, see FIG. 3 of U.S. Pat. No. 5,489,875 and the text corresponding thereto). In the idealized situation considered in the prior art, the monitor signal and the internal signal are equal, with $H_s(f)=h=1$ (906) at all frequencies, and the correlation result is a stochastic estimate of the gradient of the error signal power with respect to the CGA parameters. That is, the correlation result is proportional to the change in CGA parameter settings that would result in the greatest increase in error signal power. Sign reversal and integration causes the CGA parameters to be corrected in the direction that most decreases the error signal power, and the adaptation loop converges correctly to the setting of GA and GB that minimizes error signal power, with a time constant determined by the value K of the loop gain amplifier 904.

To continue this example, when the linearizer is implemented, it will differ from the ideal case in that the monitor signal (bandpass signal 1 of FIG. 10) will likely have unknown phase and amplitude shifts with respect to the internal adjuster signal. These shifts are represented by the complex variable h (906) in FIG. 9. If h has a phase shift of 180 degrees, then the correlation result will be negated, and the correction to the CGA parameters will be made in a direction that maximally increases, rather than decreases, the error signal power. This, in turn, will cause the circuit to diverge from its ideal setting. More generally, a phase shift in h of over 90 degrees will cause the circuit to diverge. A phase shift value of greater than zero degrees, but less than 90 degrees, will allow the circuit to converge to its ideal setting, but with decreasing rapidity as it approaches 90 degrees.

The same problem may afflict adaptation controllers based on other algorithms that exploit the relationships among monitored signals in order to make corrections to CGA settings. For example, a least squares ("LS") algorithm or a recursive LS algorithm may also diverge (or converge more slowly) under the same phase shift conditions asset forth above for the stochastic gradient algorithm.

In a multibranch adjuster circuit, for example, the polynomial predistorter circuit of FIG. 2 or the feedforward circuit of FIGS. 4 and 6, there are further consequences of the lack of equality between an internal adjuster signal and its corresponding monitor signal. Signals carried on the branches of an adjuster tend to be highly correlated, making stochastic gradient adaptation slow. The remedy is linear transformation of the multiple branch signals to produce a multiplicity of decorrelated signals. The decorrelated signals, or modes, are then adapted individually to provide a much faster convergence. However, the lack of equality between internal and corresponding monitor signals, as modeled by the filter banks in FIG. 6, reduces the ability to decorrelate those signals completely. This results in branch signals with residual correlation, thus reducing the benefits of decorrelation. Furthermore, if the internal and monitor signals are not equal, unfavorable phase and amplitude relationships among the filters may cause one or more of the decorrelation mode adaptations to diverge, preventing adaptation altogether.

In addition, in a stochastic gradient controller, if wide power disparities exist among the decorrelated signals, stronger signals may interfere or "mask" the weaker signals, degrading the latter and slowing adaptation. To reduce this masking problem, a "partial gradient" algorithm may be used by the adaptation controller (see, for example, the partial gradient adaptation controller disclosed in U.S. Pat. No. 5,489,875), in which the correlation between two bandpass signals is approximated as a sum of partial correlations taken over limited bandwidths at selected frequencies. By making the frequencies selectable, correlations may be calculated at frequencies that do not contain strong signals, so that the strong signals do not mask the weak signals. In addition, a digital signal processor (DSP) may be used to perform correlation, because the correlations are taken over limited bandwidths. This eliminates the DC offset that otherwise appears in the output of a correlator implemented by directly mixing two bandpass signals.

FIG. 11 illustrates a partial correlator, in which local oscillators 1101 and 1102 select the frequency of the partial correlation. Frequency shifting and bandpass filtering are performed by the mixer/bandpass filter combinations 1103/1107, 1104/1108, 1105/1109, and 1106/1110. The signals output by the bandpass filters 1109 and 1110 are digitally converted, respectively, by A/D converters 1111 and 1112. Those digital signals are bandpass correlated by DSP 1113 to produce the real and imaginary components of the partial correlation. (See, for example, FIG. 9 of U.S. Pat. No. 5,489,875 for a description of the operation of a partial correlator similar to that shown in FIG. 11 herein.) However, as in the case of the stochastic gradient adaptation controller, a lack of equality between the internal signals and their corresponding monitor signals (for example, bandpass signal 1) may cause either divergence or slowed convergence of the partial gradient adaptation controller of FIG. 11.

Accordingly, self-calibrated power amplifier linearizers are desired to compensate for the lack of equality between the internal adjuster signals and their corresponding monitor signals, and to overcome the resulting divergence, or slowed convergence, of the adaptation controllers used therein.

SUMMARY OF THE INVENTION

In one aspect of the presented invention, an amplifier linearizer includes a signal adjuster having an internal signal, and an adaptation controller for monitoring the signal adjuster. The internal signal at an input to the adaptation controller is deemed a monitor signal. The adaptation controller generates a control signal for the signal adjuster by accounting for a difference between the internal and monitor signals.

This and other aspects of the invention may be ascertained from the detailed description of the preferred embodiments set forth below, taken in conjunction with the one or more of the following drawings.

DETAILED DESCRIPTION OF THE PREFERRED EMBODIMENTS

The embodiments of the present invention are directed to self-calibration techniques by which the adaptation controller (1) determines the frequency responses of the observation filters between the internal signals and the monitor signals (and hence, the frequency responses of the underlying circuit components modeled by those observation filters) and (2) corrects for these responses, so that the monitored signals are substantially representative of the internal signals of the adjuster circuits. The benefits of self-calibration are (1) reliable adaptation, without risk of divergence; (2) faster adaptation than without self-calibration; and (3) access to methods that decorrelate the internal signals, explicitly or implicitly, to allow fast adaptation of all the signal modes. This self-calibration can be performed upon the initialization of the linearizer (for example, at device turn-on), or from time-to-time as needed. Further, the self-calibration is performed by the linearizer itself without human intervention.

Figure 12:
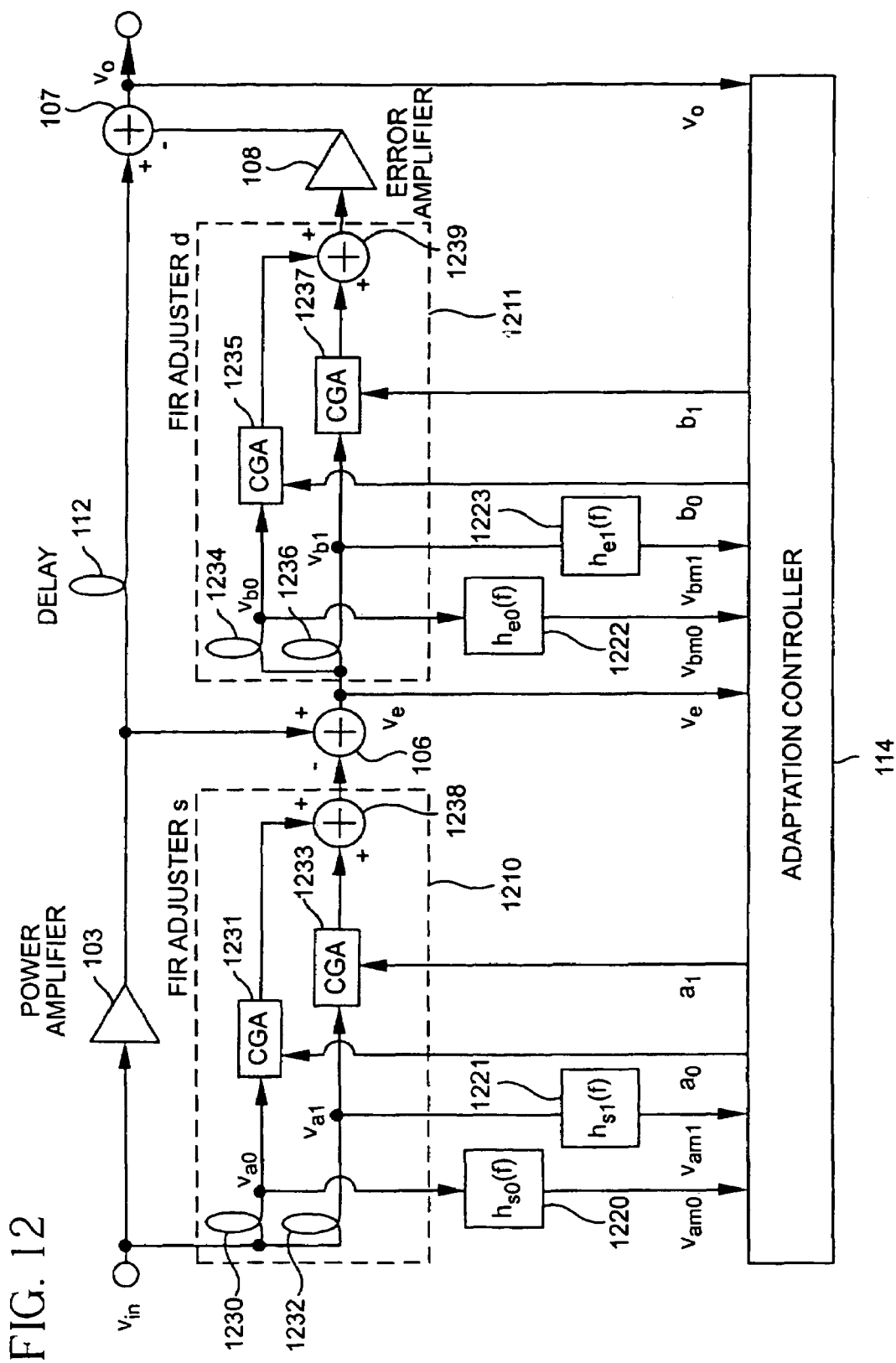
FIG. 12 is a two-branch feedforward circuit with observation filters included in the monitor signal paths of the FIR adjuster branches.

FIG. 12 illustrates a feedforward linearizer in which an FIR adjuster s 1210 in the signal cancellation circuit is located parallel to the power amplifier 103 (the case where the FIR adjuster s is in series with the power amplifier is discussed further below). The FIR adjuster s has two branches, the upper including a delay 1230 and a CGA 1231, and the lower including a delay 1232 and a CGA 1233. The outputs of the CGAs 1231 and 1233 are summed by the combiner 1238. The feedforward linearizer also has an FIR adjuster d 1211 in the distortion cancellation circuit. The FIR adjuster d also has two branches, the upper including a delay 1234 and a CGA 1235, and the lower including a delay 1236 and a CGA 1237. The outputs of the CGAs 1235 and 1237 are summed by the combiner 1239. Although FIG. 12 illustrates FIR adjusters with two branches, the self-calibration techniques of the present invention apply to adjusters with one or more branches. In addition, these self-calibration techniques are described below with respect to FIR adjuster circuits for sake of clarity. However, those skilled in the art will recognize that these techniques apply to a wide range of adjuster circuits having structures as described above, including, but without limitation, FIR adjusters, polynomial adjusters, and adjusters with general filters on the branches.

In the circuit shown in FIG. 12, the complex gains (amplitude and phase) of the observation filters $h_{s0}(f)$ 1220, $h_{s1}(f)$ 1221, $h_{e0}(f)$ 1222 and $h_{e1}(f)$ 1223 are first determined. Then those gains are used to adjust the respective monitor signals $v_{am0}$, $v_{am1}$, $v_{bm0}$ and $v_{bm1}$ so they are representative of the corresponding internal adjuster signals $v_{a0}$, $v_{a1}$, $v_{b0}$ and $v_{b1}$.

Figure 10:
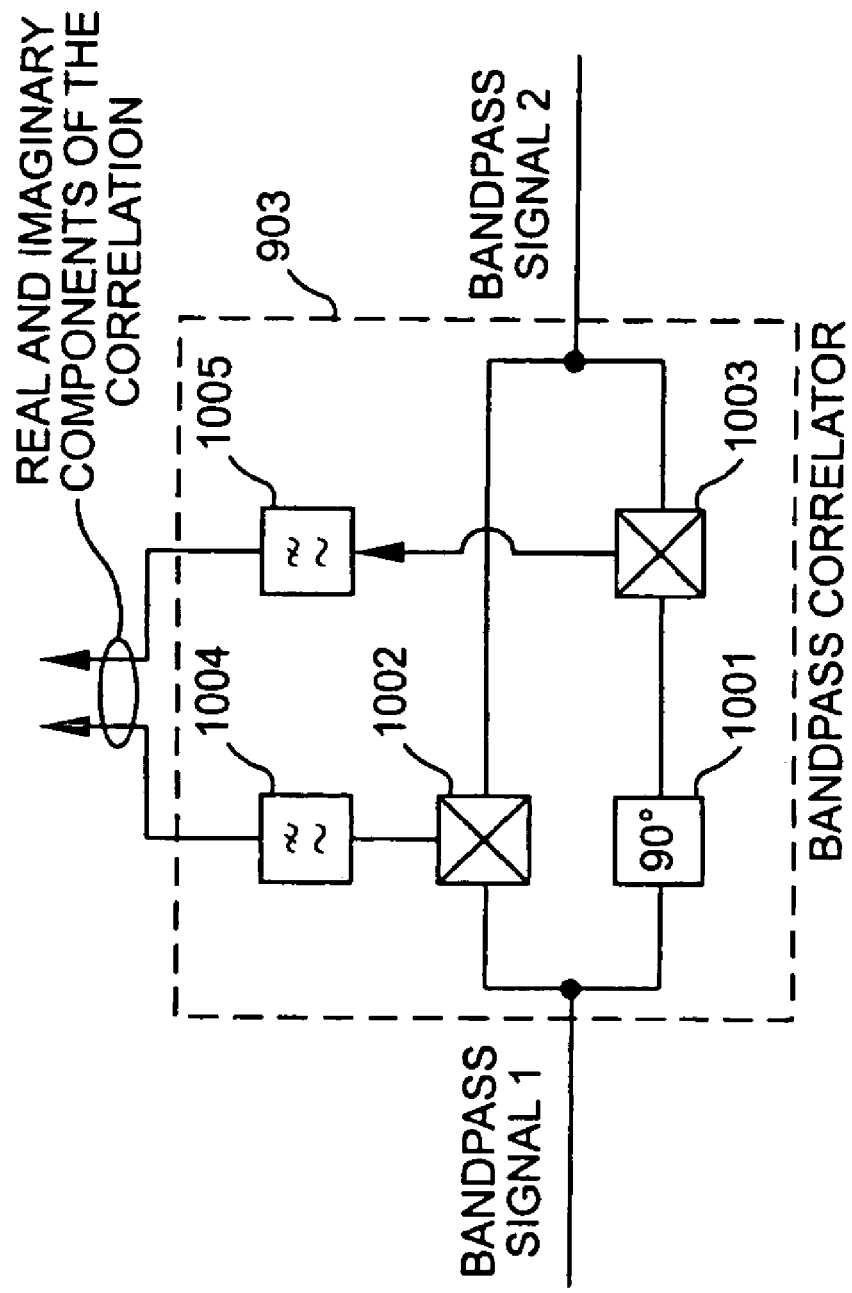
FIG. 10 is an example of the bandpass correlator used by the adaptation controller shown in FIG. 9.

In one embodiment, it is assumed that the observation filters do not depend on frequency, so that they are each characterized by a single complex gain, i.e., $h_{s0}$, $h_{s1}$, $h_{e0}$, and $h_{e1}$. With reference to FIG. 12, the adaptation controller 1214 determines the complex gain $h_{s0}$ as follows:

(1) set the power amplifier 103 in standby mode, so that its output is zero;

(2) set the CGA 1233 complex gain $a_1$ to zero through an appropriate choice of the control voltages, so that the corresponding CGA output is zero;

(3) set the CGA 1231 complex gain $a_0$ to some nominal value $a_0'$ through appropriate choice of control voltages;

(4) apply an input signal with components at frequency $f_1$ to the amplifier, or use an internal pilot signal generator 113 to generate a tone for calibration;

(5) in the adaptation controller, use a bandpass correlator (for example, the bandpass correlator shown in FIG. 10) to produce the correlation of signal $v_e$ with monitor signal $v_{am0}$; the result is:

$C_{eam0} = a_0'^* h_{s0}^* P_{a0}$, where the asterisk denotes complex conjugation and $P_{a0}$ denotes the power of signal $v_{a0}$;

(6) in the adaptation controller, use a bandpass correlator to produce the correlation of monitor signal $v_{am0}$ with itself; the result is:

$C_{am0} = |h_{s0}|^2 * P_{a0}$, where the bars denote the magnitude of a complex quantity; and (7) determine the observation filter gain as:

$$h_{s0} = a_0'^* C_{am0} / C_{eam0}.$$

The gain $h_{s1}$ is determined in a similar fashion with branch "0" set to zero ($a_0 = 0$) and branch "1" enabled ($a_1 = a_1'$).

The adaptation controller 1214 determines the complex gain $h_{e0}$ as follows:

(1) set the power amplifier in standby mode, so that its output is zero, and set at least one of the CGA gains ($a_0$ or $a_1$) in the signal FIR adjuster s to a non-zero value, so that the power of the error signal $P_e$ is non-zero;

(2) set the CGA 1237 complex gain $b_1$ to zero through an appropriate choice of the control voltages, so that the corresponding CGA output is zero;

(3) set the CGA 1235 complex gain $b_0$ to some nominal value $b_0'$ through appropriate choice of control voltages;

(4) apply an input signal with components at frequency $f_1$ to the amplifier, or use an internal pilot signal generator 113 to generate a tone for calibration;

(5) in the adaptation controller, use a bandpass correlator to produce the correlation of signal $v_o$ with monitor signal $v_{bm0}$; the result is:

$C_{obm0} = b_0'^* h_{e0}^* P_{b0}$, where the asterisk denotes complex conjugation and $P_{b0}$ denotes the power of signal $v_{b0}$;

(6) in the adaptation controller, use a bandpass correlator to produce the correlation of monitor signal $v_{bm0}$ with itself; the result is:

$C_{bm0} = |h_{e0}|^2 * P_{b0}$, where the bars denote the magnitude of a complex quantity; and (7) determine the observation filter gain as:

$h_{e0} = b_0'^* C_{bm0}/C_{obm0}$.

The gain $h_{e1}$ is determined in a similar fashion with branch "0" set to zero ($b_0 = 0$) and branch "1" enabled ($b_1 = b_1'$).

Figure 11:
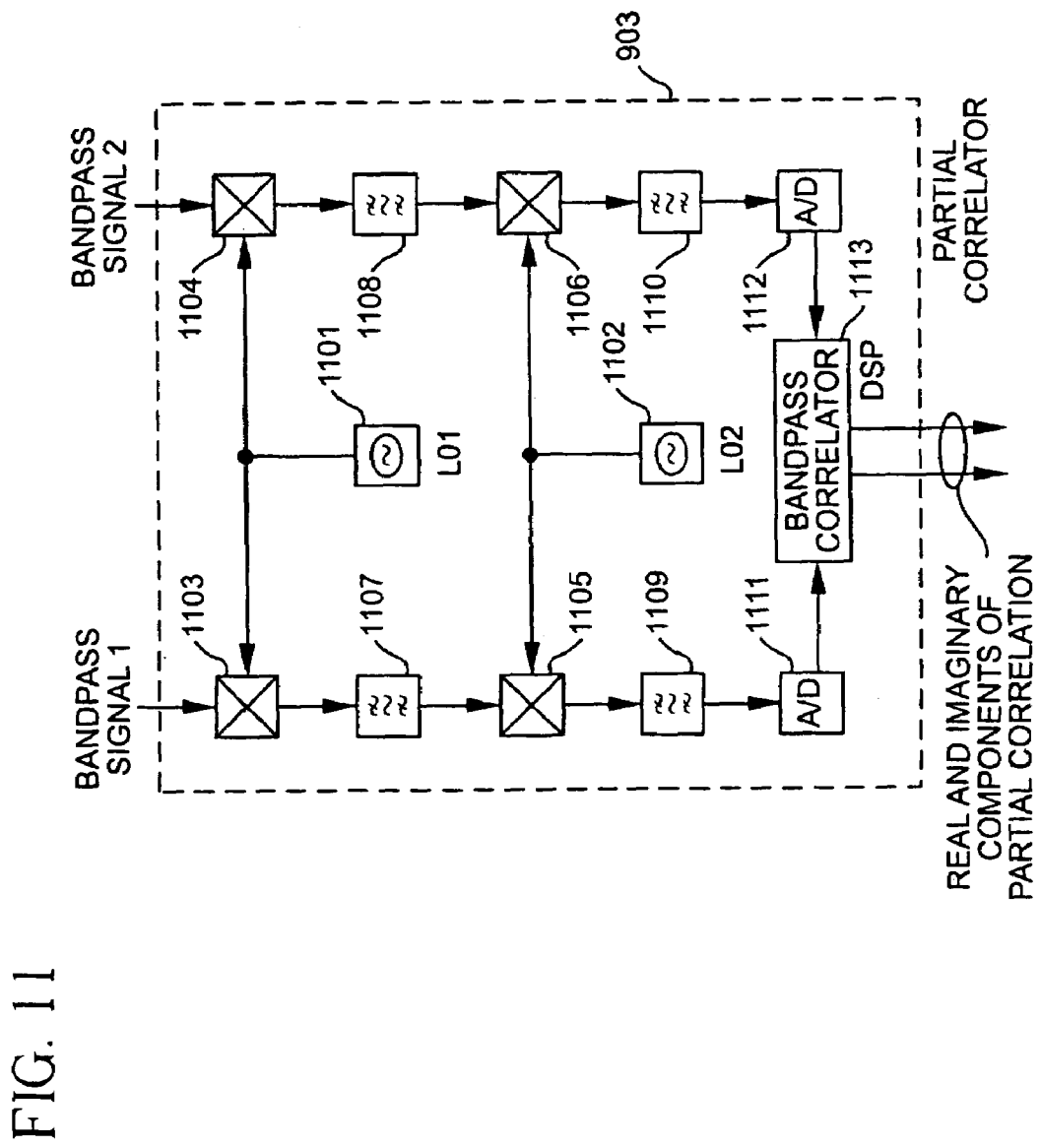
FIG. 11 is an example of a partial bandpass correlator used in a partial gradient adaptation controller.

In another embodiment, it is assumed that the observation filters depend on frequency. Consequently, to approximate their frequency responses, the adaptation controller determines their gains at a selected set of N frequencies $f_i$, $i = 1, 2, \ldots, N$. The adaptation controller 1214 determines the gain $h_{s0}(f_1)$ at frequency $f_1$ as follows:

(1) set the power amplifier 103 to standby mode, so that its output is zero;

(2) set the CGA 1233 gain of $a_1$ to zero through appropriate choice of the control voltages, so that the CGA output is zero;

(3) set the CGA 1231 gain $a_0$ to some nominal value $a_0'$ through appropriate choice of control voltages;

(4) apply an input signal with components at frequency $f_1$ to the amplifier, or use an internal pilot signal generator 113 set to frequency $f_1$;

(5) use a partial correlator (for example, the partial correlator shown in FIG. 11), with local oscillators set to select frequency $f_1$, to produce the correlation of signal $v_e$ with monitor signal $v_{am0}$; the result is:

$C_{eam0}(f_1) = a_0^* h_{s0}^*(f_1) * P_{a0}(f_1)$, where $P_{a0}(f_1)$ denotes the power of signal $v_{a0}$ at frequency $f_1$;

(6) use a partial correlator, with local oscillators set to select frequency $f_1$, to produce the correlation of monitor signal $v_{am0}$ with itself; the result is:

$C_{am0}(f_1) = |h_{s0}(f_1)|^2 * P_{a0}(f_1)$;

(7) determine the observation filter gain at frequency $f_1$ as:

$h_{s0}(f_1) = a_0' C_{am0}(f_1)/(C_{eam0}(f_1))$

Similarly, the adaptation controller 1214 determines the gain $h_{e0}(f_1)$ at frequency $f_1$ as follows:

(1) set the power amplifier 103 to standby mode, so that its output is zero, and set at least one of the CGA gains ($a_0$, $a_1$) in the signal cancellation circuit to a non-zero value, so that the power of the error signal $P_e(f_1)$ is non-zero;

(2) set CGA 1237 gain $b_1$ to zero through appropriate choice of the control voltages, so that the corresponding CGA output is zero;

(3) set the CGA 1235 gain $b_0$ to some nominal value $b_0'$ through appropriate choice of control voltages;

(4) apply an input signal with components at frequency $f_1$ to the amplifier, or use an internal pilot signal generator 113 set to frequency $f_1$;

(5) use a partial correlator, with local oscillators set to select frequency $f_1$, to produce the correlation of signal $v_0$ with monitor signal $v_{bm0}$; the result is:

$C_{obm0}(f_i) = b_0'^* h_{e0}^*(f_1) * P_{b0}(f_1)$, where $P_{b0}(f_1)$, denotes the power of signal $v_{b0}$ at frequency $f_1$;

(6) use a partial correlator, with local oscillators set to select frequency $f_1$, to produce the correlation of monitor signal $v_{bm0}$ with itself; the result is:

$C_{mb0}(f_j) = |h_{e0}(f_1)|^2 * P_{b0}(f_1)$;

(7) determine the observation filter gain at frequency $f_1$ as:

$h_{e0}(f_1) = b_0' C_{bm0}(f_1)/(C_{obm0}(f_1))$.

The complex gains $h_{s0}(f_i)$ and $h_{e0}(f_i)$ at frequencies $i = 2, 3, \ldots, N$ are determined similarly. The frequency responses of the remaining observation filters $h_{s1}(f)$ and $h_{e1}(f)$ are determined by selecting them one at a time through choice of CGA gains, and then repeating the above-described methods for each frequency $f_i$, $i = 1, 2, \ldots, N$.

In the above procedures, the frequencies $f_i$ at which calibration is obtained are the same for the signal and distortion cancellation circuits. However, the frequencies $f_i$ at which calibration is obtained may differ between the signal and distortion cancellation circuits.

To self-calibrate a single-branch adjuster circuit, step (2) of the above-described methods is eliminated. To self-calibrate an adjuster circuit having more than two branches, one branch at a time is enabled, while all others are set to zero, until all corresponding observation filter gains are determined.

Computing the complex gains of the observation filters for the signal cancellation circuit may be done without computing the same for the distortion cancellation circuit, and vice-versa. Also, computing the complex gains of one or more of the observation filters for the distortion cancellation circuit may be done prior to computing the same for the signal cancellation circuit, and vice-versa.

Moreover, although the adjusters in this embodiment had delay lines in the branches, as shown in FIG. 12, the procedures for estimating the observation filter complex gains, whether they be frequency-independent or frequency-dependent, are equally applicable to adjusters constructed with filters of any type in place of one or more of the delay lines 1230, 1232, 1234 and 1236.

Once the observation filter complex gains are computed, the corresponding monitor signals need to be appropriately adjusted. The adaptation controller divides the monitor signals by the respective observation filter complex gains (either frequency-independent or frequency-dependent, as the case may be) to approximate the true internal adjuster circuit signals. For example, for branch k and frequency $f_i$, the controller calculates:

$v_{ak} = v_{amk}/h_{sk}(f_i)$; and $v_{bk} = v_{bmk}/h_{ek}(f_i)$.

Once these self-calibration procedures are performed, the effect on convergence is dramatic. This is particularly true when a partial correlator is implemented using a DSP. Convergence is reliable and robust in the face of amplitude and phase changes introduced by the cables, circuit board traces, and other components in the signal paths that convey the internal signals to the adaptation controller. More generally, any adaptation algorithm, such as stochastic gradient, with or without decorrelation of the branch signals, or least squares, can be made insensitive to these amplitude and phase changes, because the adaptation controller can always recover the internal signals from the monitor signals by dividing them by the corresponding determined observation filter complex gains.

Variations of the self-calibration procedures of the present invention will be evident to those skilled in the art. Two are listed here for illustrative purposes.

In one variation (described here only for a two-branch signal adjuster circuit, but equally applicable to a two-branch distortion adjuster circuit, as appropriately modified in accord with the method for computing $h_{e0}(f_i)$ and $h_{e1}(f_i)$ described above), the adaptation controller 1214 simultaneously determines the frequency responses of all observation filters at frequency $f_i$ as follows:

(1) set the power amplifier 103 to standby mode, so that its output is zero;

(2) set all the CGA gains to non-zero nominal values $a_k'$, k=0, ... K−1, where k indexes the branch and there are K branches (in FIG. 12, the circuit is illustrated for K=2 branches);

(3) apply an input signal with components at frequency $f_i$ to the amplifier, or use an internal pilot signal generator 113 set to frequency $f_i$;

(4) use partial correlators to measure all the pairwise correlations among the monitor signals at frequency $f_i$; for K=2, this results in:

$$C_{am0}(f_i)=P_{a0}(f_i)*|h_{s0}(f_i)|^2$$

$$C_{am1}(f_i)=P_{a1}(f_i)*|h_{s1}(f_i)|^2$$

$$C_{am01}(f_i)=P_{a01}(f_i)*h_{s0}(f_i)*h^*_{s1}(f_i)$$

where $P_{a0}(f_i)$ denotes the power of $v_{a0}$ at $f_i$, $P_{a1}(f_i)$ denotes the power of $v_{a1}$ at $f_i$, and $P_{a01}(f_i)$ denotes the "crosspower" (the correlation) of $v_{a0}$ and $v_{a1}$ at $f_i$;

(5) use partial correlators to measure the correlation between the error signal and each of the monitor signals; for K=2, this results in $$C_{eam0}(f_i)=a_0'^*P_{a0}(f_i)*h^*_{s0}(f_i)+a_1'^*P_{a01}(f_i)*h^*_{s0}(f_i)$$

$$C_{eam1}(f_i)=a_0'^*P_{a01}(f_i)*h^*_{s1}(f_i)+a_1'^*P_{a1}(f_i)*h^*_{s1}(f_i)$$

which becomes, after substitution for the powers, a set of equations in the observation filter gains:

$$C_{eam0}(f_i)=a_0'^*C_{am0}(f_i)*h_{s0}(f_i)^{-1}+a_1'^*C_{am01}(f_i)*h_{s1}(f_i)^{-1}$$

$$C_{eam1}(f_i)=a_0'^*C_{am01}(f_i)*h_{s0}(f_i)^{-1}+a_1'^*C_{am1}(f_i)*h_{s1}(f_i)^{-1}$$

(6) solve the set of equations for $h_{s0}(f_i)^{-1}$ and $h_{s1}(f_i)^{-1}$; take their reciprocals to obtain the desired frequency responses $h_{s0}(f_i)$ and $h_{s1}(f_i)$.

The method extends in a straightforward way to signal or distortion adjuster circuits with more than two branches.

In a second variation, described here only for the signal adjuster circuit (but equally applicable to distortion adjuster, appropriately modified as described above), the adaptation controller 1214 determines the responses of the observation filters at frequency $f_i$ without putting the power amplifier 103 in standby mode. It will be described here only for one of the branches (branch k):

(1) set all of the CGA gains to zero;

(2) apply an input signal with components at frequency $f_i$ to the amplifier, or use an internal pilot signal generator 113 set to frequency $f_i$; the power of the signal is set to operate the power amplifier at a nominal operating point;

(3) use a partial correlator, with local oscillators set to select frequency $f_i$, to produce the correlation of signal $v_e$ with monitor signal $v_{amk}$; the result is a bias term $C'_{eamk}(f_i)$;

(4) set the CGA gain $a_k$ to some nominal value $a_k'$ through appropriate choice of control voltages;

(5) use a partial correlator, with local oscillators set to select frequency $f_i$, to produce the correlation of signal $v_e$ with monitor signal $v_{amk}$; the result is $$C_{eamk}(f_i)=a_k'h^*_{sk}(f_i)*P_{ak}(f_i)+C'_{eamk}(f_i);$$

(6) use a partial correlator, with local oscillators set to select frequency $f_i$, to produce the correlation of monitor signal $v_{amk}$; the result is $$C_{amk}(f_i)=|h_{sk}(f_i)|^2*P_{ak}(f_i);$$

(7) determine the observation filter gain at frequency $f_i$ as $$h_{sk}(f_i)=a_k'^*C_{amk}(f_i)/(C_{eamk}(f_i)-C'_{eamk}(f_i)).$$

Figure 7:
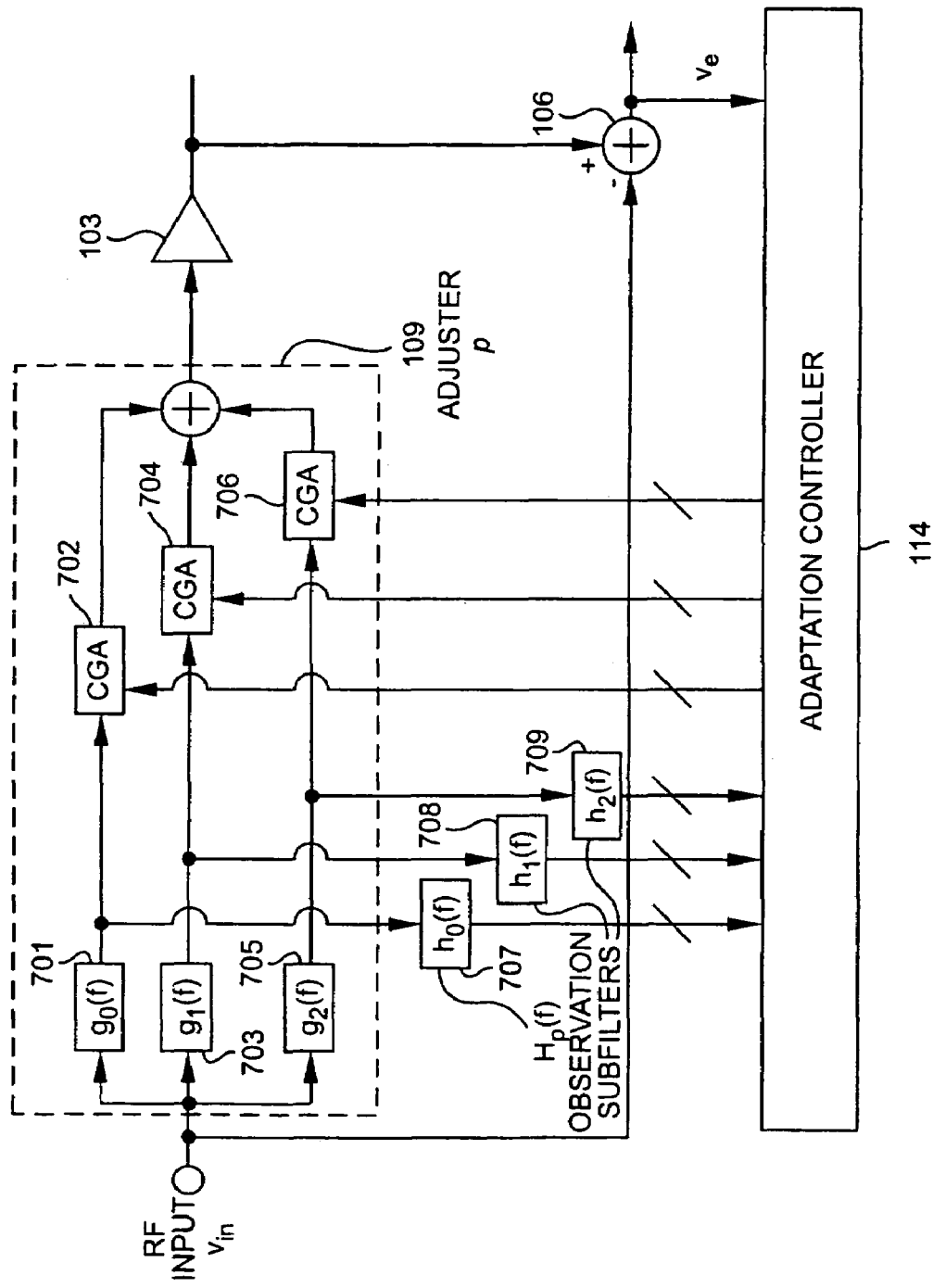
FIG. 7 is a generic FIR signal adjuster circuit showing a bank of observation subfilters to model the lack of equality between the internal signal adjuster circuit signals and the corresponding monitor signals used by the adaptation controller.
Figure 8:
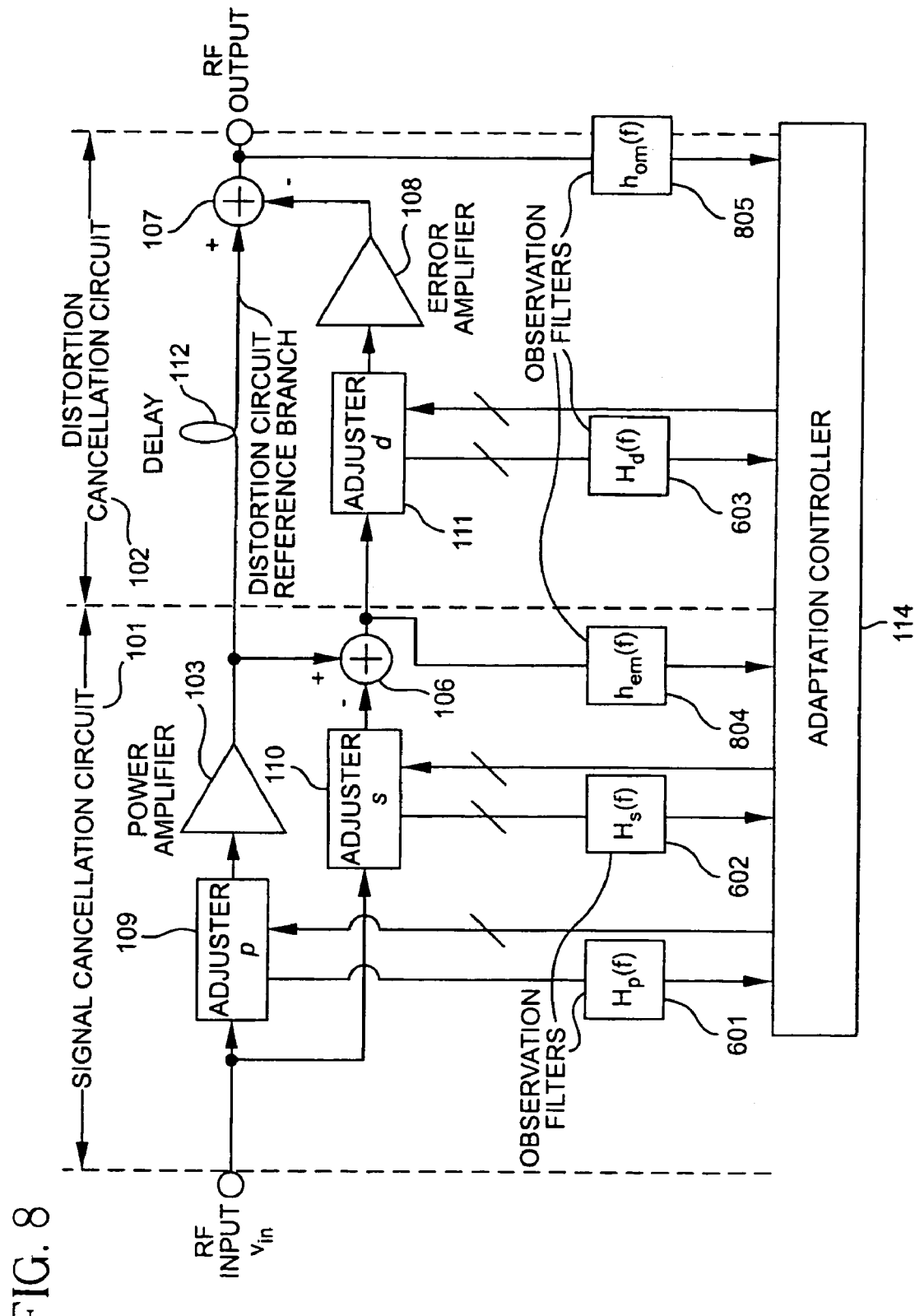
FIG. 8 is a block diagram of a generic power amplifier linearizer circuit, in which observation filters are included to model the lack of equality between the internal adjuster signals, error output signal $v_e$ and RF output signal $v_o$, and the corresponding monitor signals used by the adaptation controller.
Figure 9:
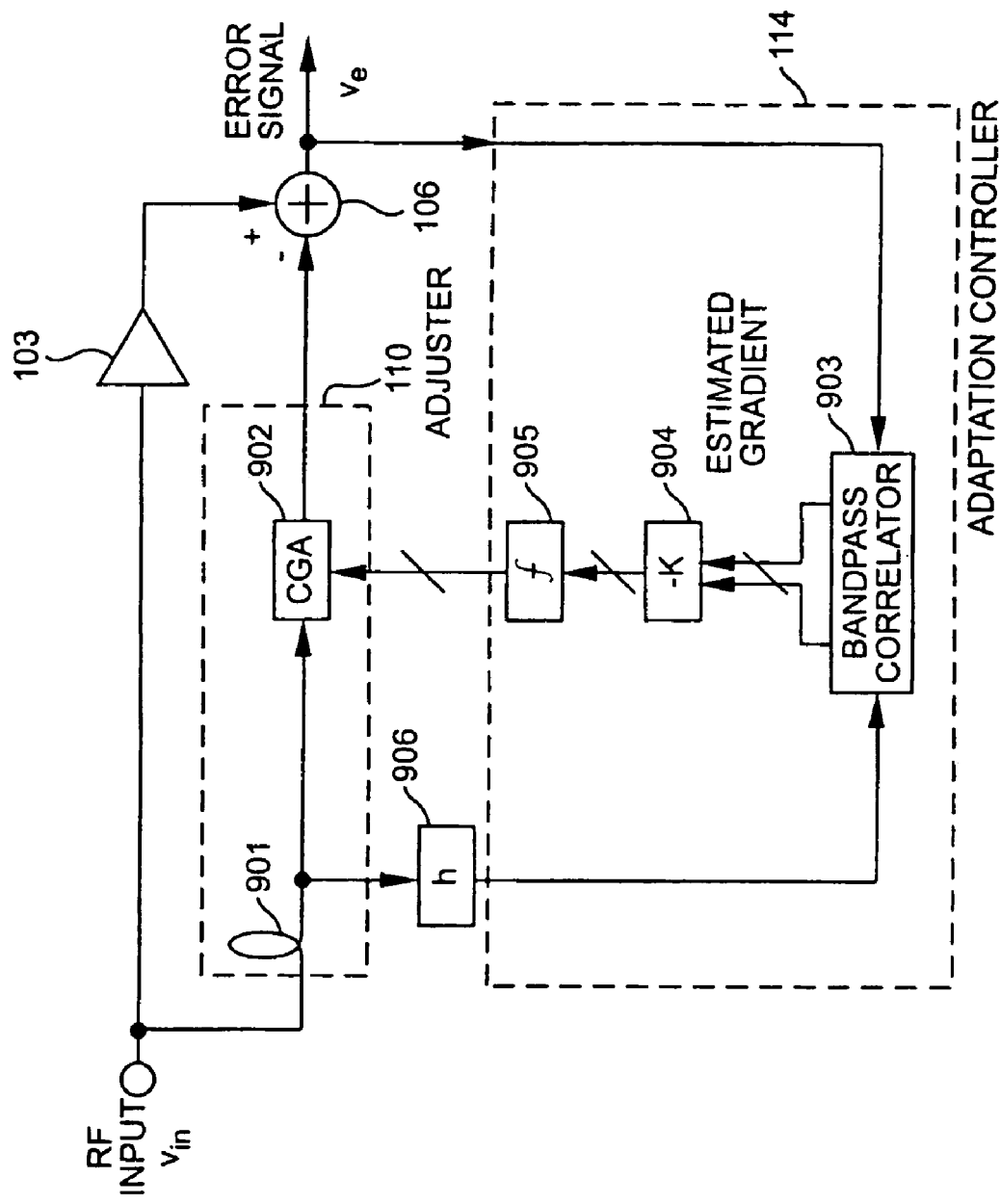
FIG. 9 is an example of a one-branch feedforward signal adjuster circuit, and a stochastic gradient adaptation controller using a bandpass correlator, in which observation filter h is included to model the lack of equality between the internal signal adjuster signal and the corresponding monitor signal used by the adaptation controller.
Figure 13:
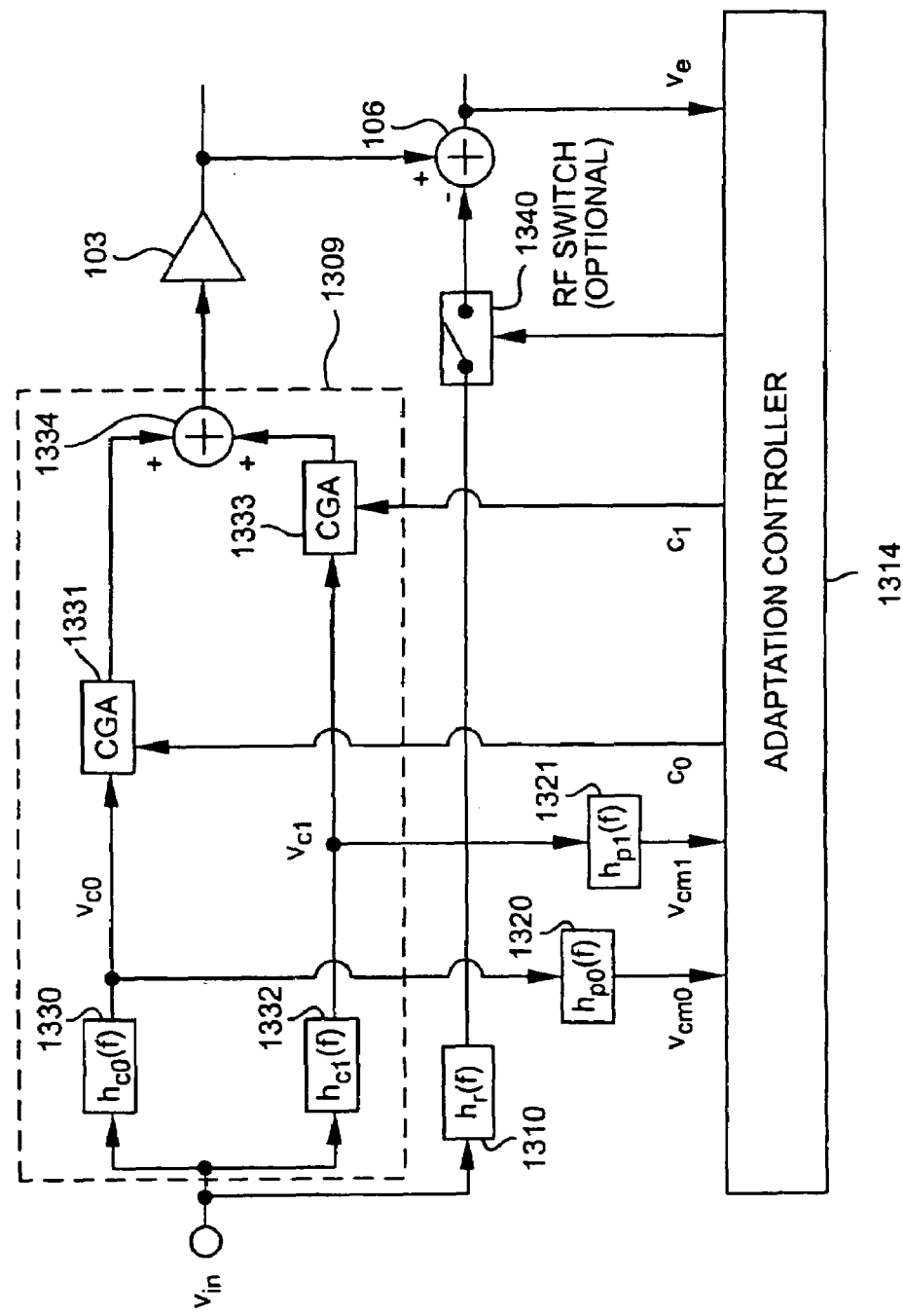
FIG. 13 is a two-branch feedforward signal cancellation circuit with observation filters for the adjuster branches.

In another aspect of the present invention, the adjuster circuit 1309 precedes the power amplifier 103, as shown in FIG. 13, an expanded version of FIG. 7. The branch filters $h_{e0}(f)$ 1330 and $h_{e1}(f)$ 1332 can be as simple as delays or as complex as general linear filters. These filters respectively precede CGAs 1331 and 1332, the outputs of which are summed by combiner 1334. In this model, the amplifier gain is included in the branch filter responses. The filter $h_r(f)$ 1310 in the reference branch may also be simple or complex; even if such a filter is not inserted explicitly, $h_r(f)$ 1310 represents the response of the branch. The RF switch 1340 is optional; as explained below, its presence or absence gives rise to two embodiments. The objective in both cases is to determine the responses of the observation filters $h_{p0}(f)$ 1320 and $h_{p1}(f)$ 1321 at selected frequencies.

In the first of such embodiments, the RF switch 1340 is absent and there is an unobstructed path from the output of filter $h_r(f)$ 1310 to the input of the subtractor 106. To determine the response $h_{pk}(f_i)$ of the observation filter k at frequency $f_i$ the adaptation controller 1314 performs the following actions:

(1) set the power amplifier to standby mode, so that its output is zero;

(2) apply an input signal containing the frequency components at frequency $f_i$ or use an internal pilot signal generator set to frequency $f_i$; the power of the signal is set to operate the power amplifier at a nominal operating point;

(3) use a partial correlator, with local oscillators set to select frequency $f_i$, to produce the correlation of signal $v_e$ with monitor signal $v_{cmk}$; the result is a bias term:

$$C'_{ecmk}(f_i)=-h_r(f_i)*h^*_{pk}(f_i)*h^*_{ck}(f_i)*P_{in}(f_i),\text{ where}$$

$P_{in}(f_i)$ is the input power at frequency $f_i$;

(4) restore the power amplifier to operational mode;

(5) set the branch-k CGA gain to some nominal value $c'_k$; set all other CGA gains to zero;

(6) use a partial correlator, with local oscillators set to select frequency $f_i$, to produce the correlation of signal $v_e$ with monitor signal $v_{emk}$; the result is:

$$C_{ecmk}(f_i)=(c'_k*h_{ck}(f_i)-h_r(f_i))*h^*_{pk}(f_i)*h^*_{ck}(f_i)*P_{in}(f_i);$$

(7) use a partial correlator, with local oscillators set to select frequency $f_i$, to produce the correlation of monitor signal $v_{cmk}$ with itself; the result is:

$C_{cmk}(f_i)=|h_{pk}(f_i)|^2 * |h_{ck}(f_i)|^2 * P_{in}(f_i);$ (8) determine the branch-k observation filter response at frequency $f_i$ as:

$h_{pk}(f_i)=c'_k C_{cmk}(f_i)/(C_{ecmk}(f_i)-C'_{ecmk}(f_i)).$

The observation filter responses for the other filters are determined similarly.

In the second embodiment of this aspect of the present invention, the RF switch 1340 is present. As will be seen, it simplifies the calibration procedure significantly. To determine the response $h_{pk}(f_i)$ of the observation filter k at frequency $f_i$, the adaptation controller performs the following actions:

(1) open the RF switch 1340, thereby disconnecting the filter $h_r(f)$ 1310 from the subtractor 106;
(2) apply an input signal containing the frequency components at frequency $f_i$ or use an internal pilot signal generator set to frequency $f_i$; the power of the signal is set to operate the power amplifier at a nominal operating point;
(3) set the branch-k CGA gain to some nominal value $c'_k$; set all other CGA gains to zero;
(4) use a partial correlator, with local oscillators set to select frequency $f_i$, to produce the correlation of signal $v_e$ with monitor signal $v_{cmk}$; the result is:

$C_{ecmk}(f_i)=c'_k|h_{ck}(f_i)|^2 h^*_{pk}(f_i)*P_{in}(f_i),$ where $P_{in}(f_i)$ is the input power at frequency $f_i$;

(5) use a partial correlator, with local oscillators set to select frequency $f_i$, to produce the correlation of signal monitor $v_{cmk}$ with itself; the result is:

$C_{cmk}(f_i)=|h_{pk}(f_i)|^2 * |h_{ck}(f_i)|^2 * P_{in}(f_i);$ (6) determine the branch-k observation filter response at frequency $f_1$ as:

$h_{pk}(f_i)=c'_k C_{cmk}(f_i)/C_{ecmk}(f_i);$ (7) close the RF switch 1340.

The observation filter responses for the other filters are determined similarly.

Figure 14:
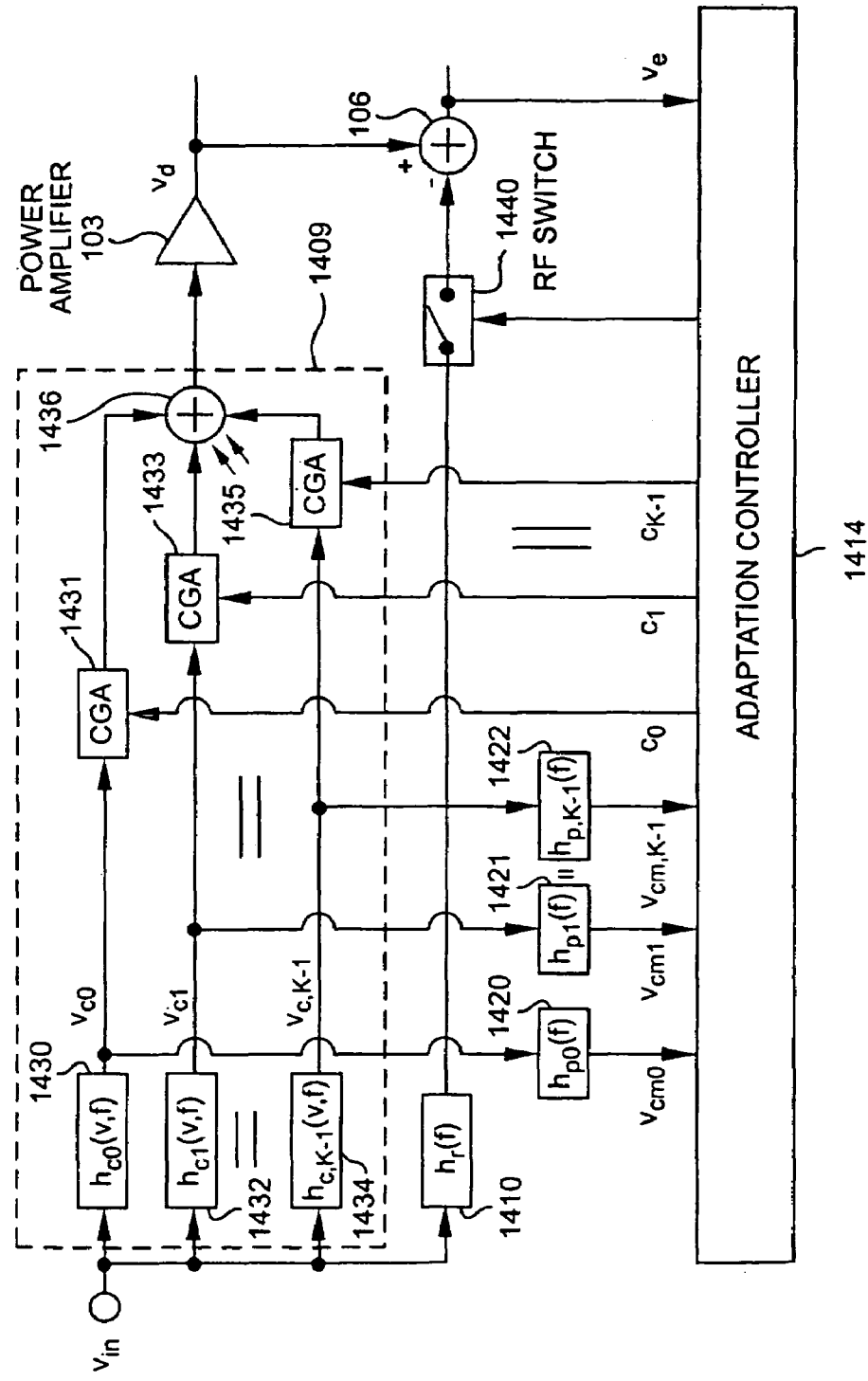
FIG. 14 is a multibranch predistorter containing general nonlinearities with frequency dependence.

In still another aspect of the present invention, the adjuster circuit 1409 precedes the power amplifier 103, as shown in FIG. 14. Branch filters $h_{c0}(v, f)$ to $h_{c,K-1}(v, f)$ (1430, 1432, 1434) are general nonlinearities with possible frequency dependence, as indicated by the two arguments v, the input signal, and f, the frequency. In implementation, they can take the form of monomial (cubic, quintic, etc.) memoryless nonlinearities. More general nonlinearities such as Bessel functions or step functions, or any other convenient nonlinearity, may also be employed. One or more of these branch filters may instead have linear characteristics and frequency dependence. For example, they may take the form of delays or general linear filters, as in the aspect of the invention described immediately above. In the most general form, the branch filters depend on both the input signal and frequency, where such dependencies may be intentional or inadvertent. In this model, the amplifier gain is included in the branch filter responses. The branch filters 1430, 1432, and 1434 respectively precede CGAs 1431, 1433, and 1435, the outputs of which are summed by combiner 1436.

The filter $h_r(f)$ 1410 in the reference branch may also be a simple delay or a more general filter; even if such a filter is not inserted explicitly, $h_r(f)$ 1410 represents the response of the branch. The objective is to determine the responses of the observation filters $h_{p0}(f)$ to $h_{p, K-1}(f)$ (1420, 1421, and 1422) at selected frequencies.

To determine the response $h_{pk}(f_i)$ of the observation filter k at frequency $f_i$, the adaptation controller performs the following actions:

(1) open the RF switch 1440, thereby disconnecting the filter $h_r(f_i)$ 1410 from the subtractor 106;
(2) apply an input signal containing the frequency components at frequency $f_i$ or use an internal pilot signal generator set to frequency $f_i$;
(3) set all CGA gains other than that for branch k to zero; select the branch-k CGA gain to $c'_k$ and the power of the input signal in some convenient combination to cause the power amplifier to operate at a preselected output power that is common to all branches k and frequencies $f_i$ in this calibration procedure; doing so makes the amplifier gain and phase shift the same for all branches and frequencies during calibration;
(4) use a partial correlator, with local oscillators set to select frequency $f_i$, to produce the correlation of signal $v_e$ with monitor signal $v_{cmk}(f_i)$; the result is:

$C_{ecmk}(f_i)=c'_k * h^*_{pk}(f_i)*P_{ck}(f_i),$ where $P_{ck}(f_i)$ is the power of signal $v_{ck}$ at frequency $f_i$;

(5) use a partial correlator, with local oscillators set to select frequency $f_i$, to produce the correlation of signal monitor $v_{cmk}(f_i)$ with itself; the result is:

$C_{cmk}(f_i)=|h_{pk}(f_i)|^2 * P_{ck}(f_i);$ (6) determine the branch-k observation filter response at frequency $f_i$ as:

$h_{pk}(f_i)=c'_k C_{cmk}(f_i)/C_{ecmk}(f_i).$ (7) close the RF switch.

The observation filter responses for the other filters are determined similarly.

As will be apparent to those skilled in the art in light of the foregoing disclosure, many alterations and modifications are possible in the practice of this invention without departing from the spirit or scope thereof. For example, the adjuster circuits of an analog predistorter or a feedforward linearizer can employ both memory and nonlinearity in their branches. A cascade combination of a monomial and a filter within a branch is one way to accomplish this.

Figure 1:
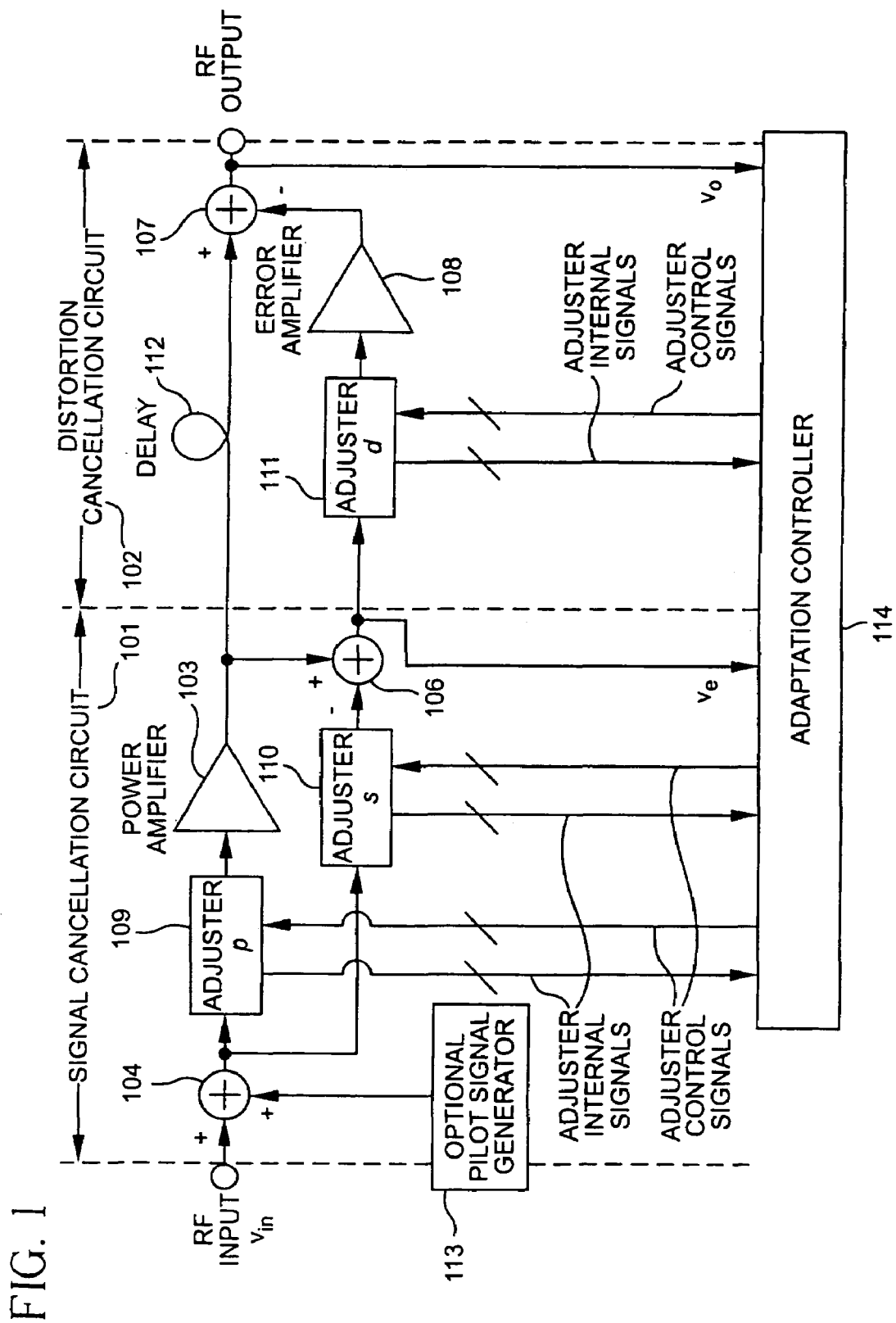
FIG. 1 is a block diagram of a generic power amplifier linearizer circuit.
Figure 2:
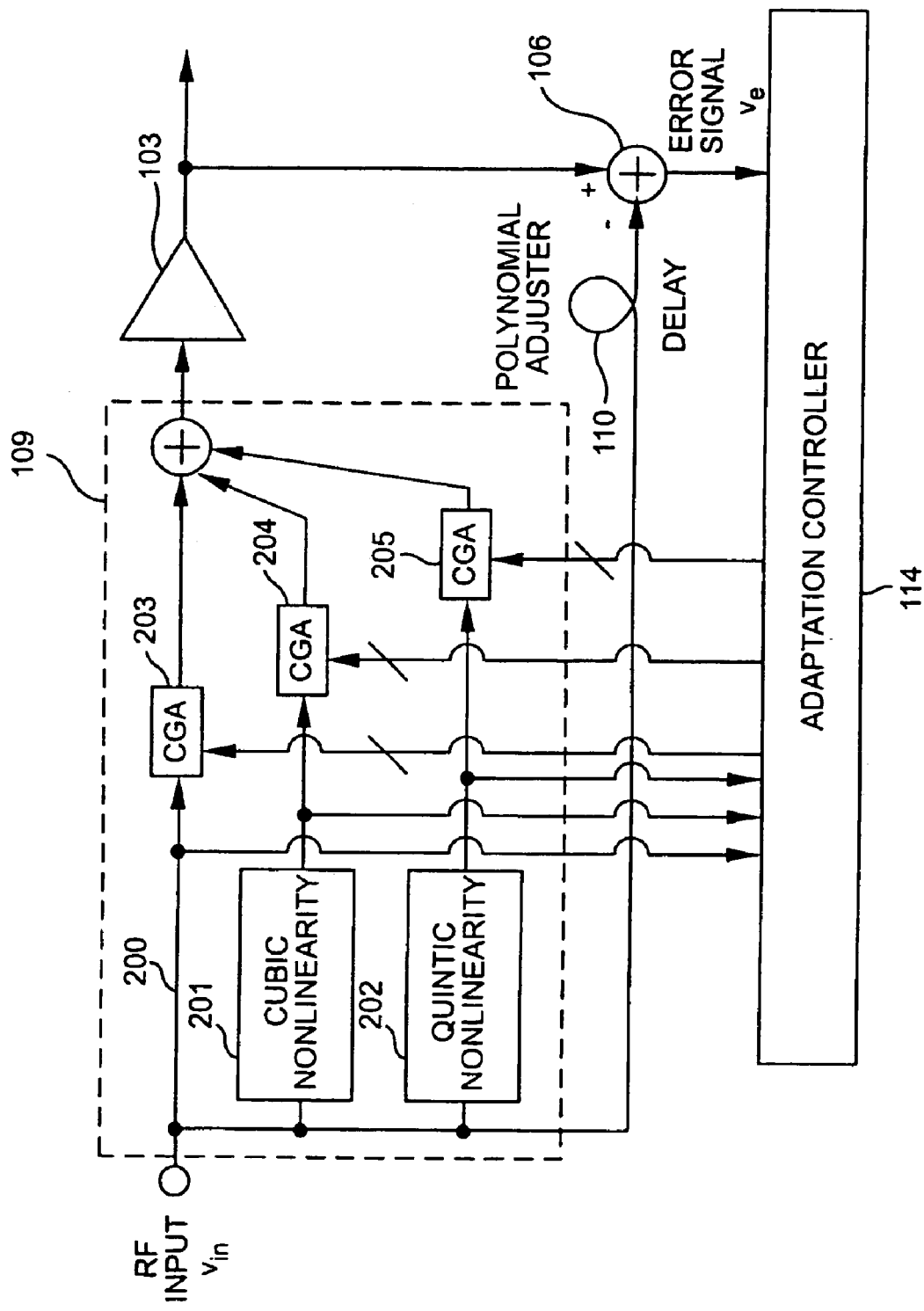
FIG. 2 shows an example of a polynomial predistortion linearizer circuit.
Figure 3B:
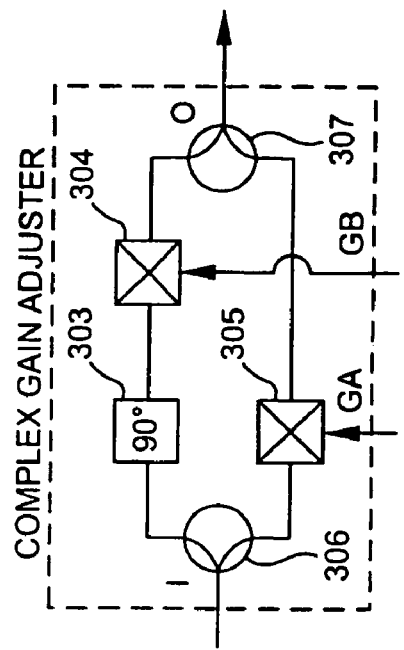
FIGS. 3A and 3B respectively show two configurations of a complex gain adjuster.
Figure 3A:
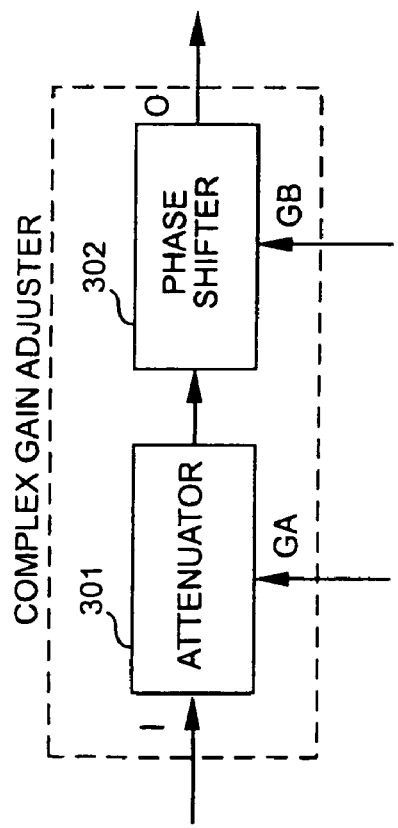
Figure 4:
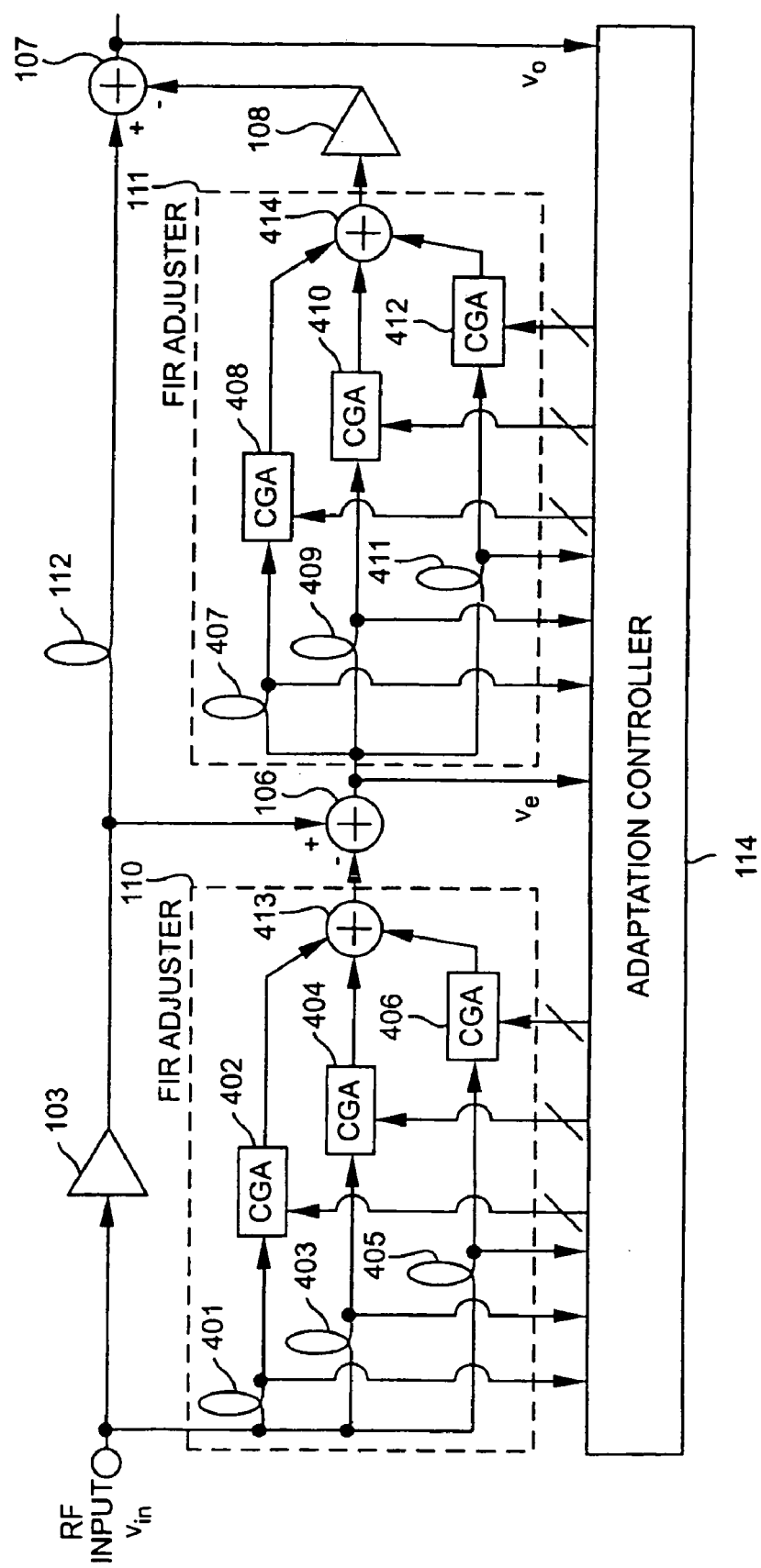
FIG. 4 shows an example of a multibranch feedforward linearizer circuit.
Figure 5:
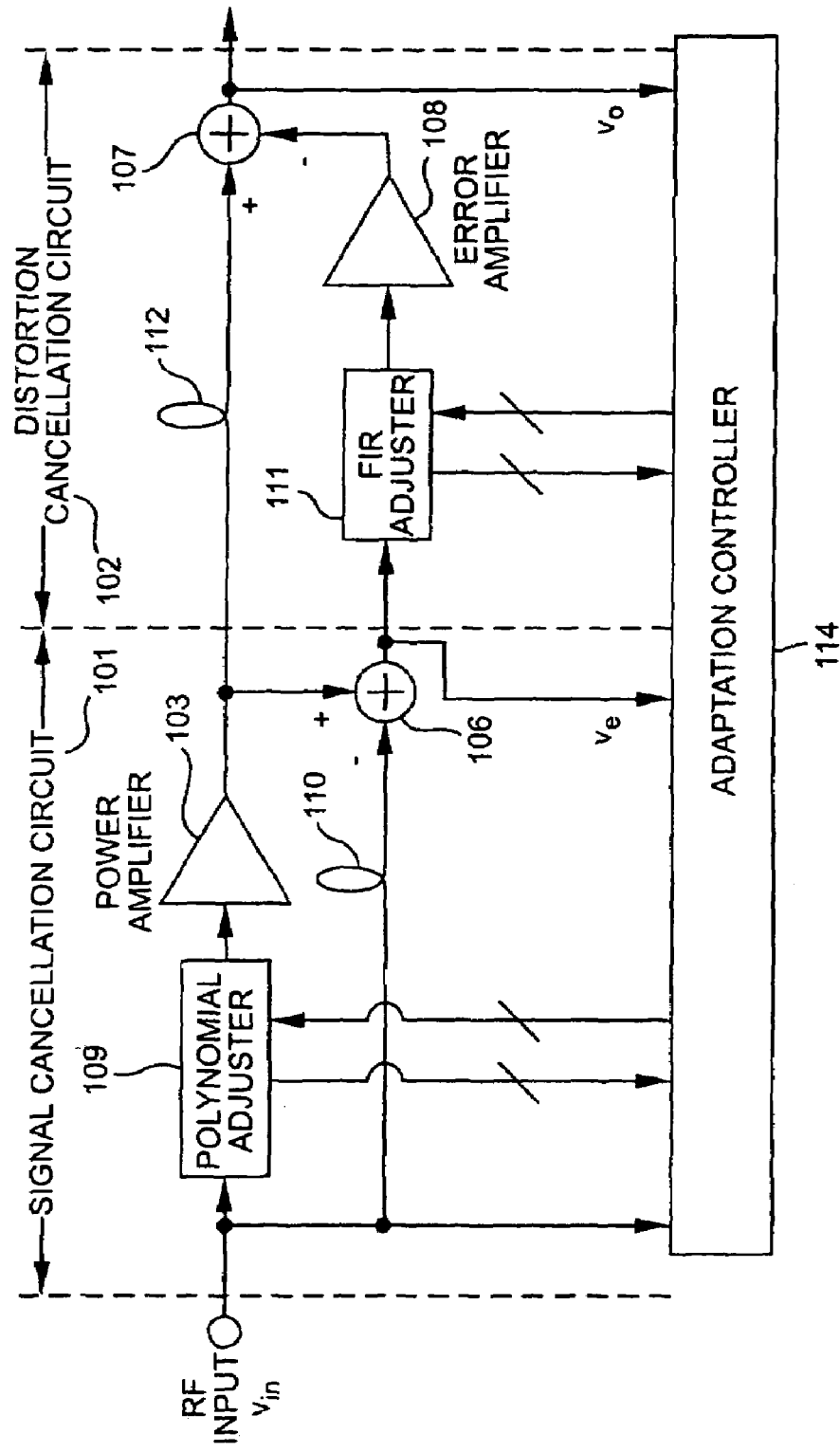
FIG. 5 shows a hybrid predistorter and feedforward linearizer circuit.
Figure 6:
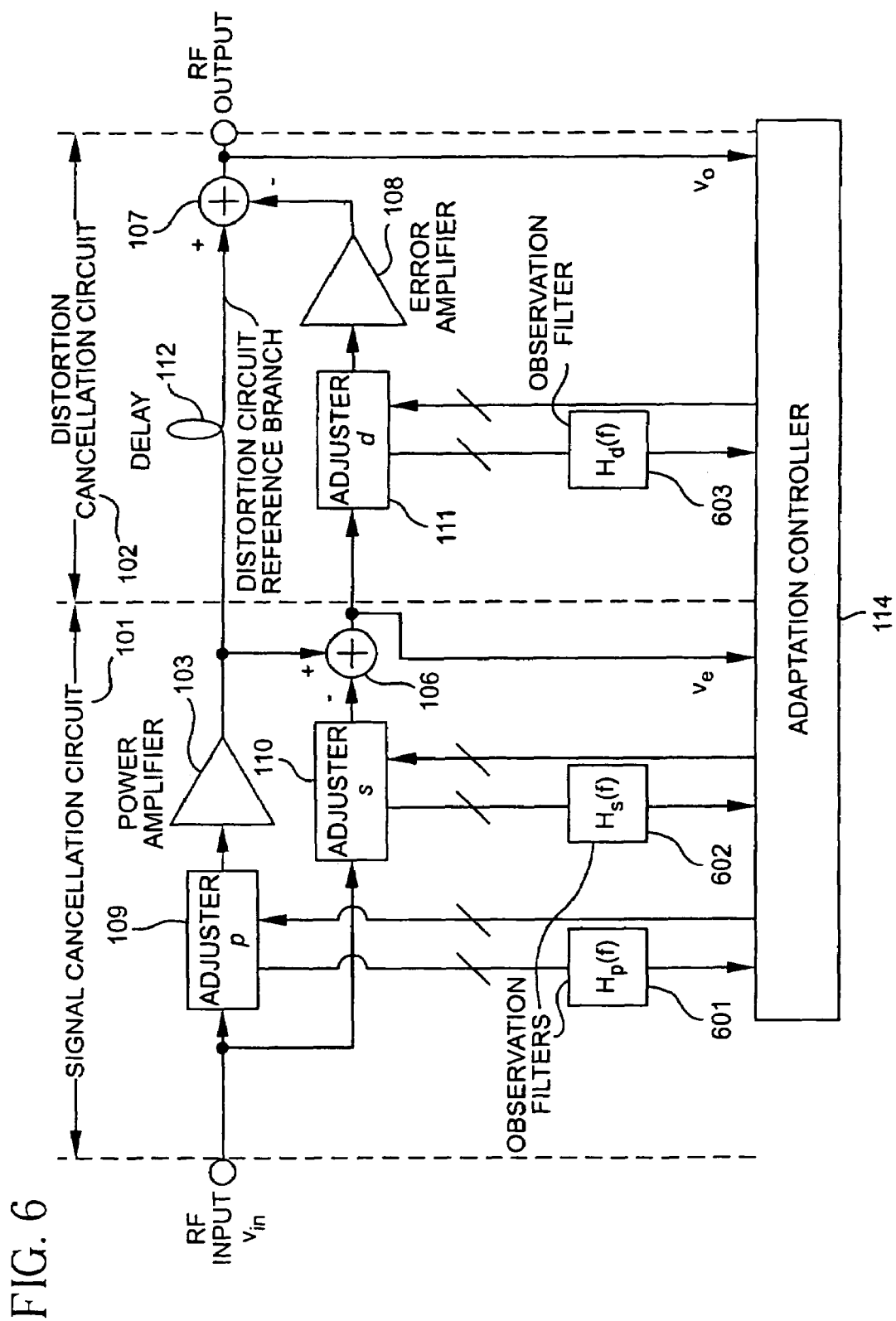
FIG. 6 is a block diagram of a generic power amplifier linearizer circuit, in which observation filters are included to model the lack of equality between the internal adjuster signals and the corresponding monitor signals used by the adaptation controller.

In addition, FIG. 5 illustrates a hybrid predistortion-feedforward circuit. The predistortion adjuster is implemented with a polynomial adjuster 109 as described above and shown in FIG. 2, and the distortion adjuster is implemented using the FIR adjuster 111 described above and shown in FIG. 4. The signal adjuster circuit 110 is a delay line having a delay selected to match that of the polynomial adjuster 109 and the power amplifier 103.

The delay 112 of the delay line in the distortion cancellation circuit 102 is selected to match that of the FIR adjuster 111 and error amplifier 108. The linearization of the power amplifier may be improved by combining the predistortion and the feedforward adjuster circuits. Further, rather than being a delay line, signal adjuster circuit 110 may be a FIR adjuster.

Other variations of the preceding linearizer circuits and self-calibration methods are deemed to be within the scope of the present invention, which is to be construed solely by the following claims.

What is claimed is:

1. A linearizer for an amplifier, comprising:
a signal adjuster having at least one internal signal;
an adaptation controller for monitoring the at least one internal signal of said signal adjuster, the at least one internal signal being conveyed as an input to said adaptation controller to form a monitor signal;

said adaptation controller operable for correcting the monitor signal by addressing at least one of phase or amplitude changes that are introduced into the internal signal as it is conveyed to form the monitor signal, the adaptation controller then generating a control signal for said signal adjuster using the corrected monitor signal.

2. A linearizer according to claim 1, wherein said adaptation controller determines a response of an observation filter representing the difference between the at least one internal signal and the monitor signal.

3. A linearizer according to claim 2, wherein said adaptation controller corrects the monitor signal by dividing the monitor signal by the observation filter response.

4. A linearizer according to claim 1, wherein said signal adjuster and an amplifier form part of a signal cancellation circuit of said linearizer.

5. A linearizer according to claim 4, wherein said signal adjuster is in series with the amplifier in the signal cancellation circuit.

6. A linearizer according to claim 4, wherein said signal adjuster is in parallel with the amplifier in the signal cancellation circuit.

7. A linearizer according to claim 1, wherein said signal adjuster forms part of a distortion cancellation circuit of said linearizer.

8. A linearizer according to claim 1, wherein said signal adjuster comprises an analog predistorter.

9. A linearizer according to claim 1, wherein said signal adjuster comprises an FIR filter.

10. A linearizer according to claim 1, wherein said signal adjuster comprises a filter having a linear combination of frequency-dependent linearities.

11. A method for generating a control signal for a signal adjuster of an amplifier linearizer, wherein the signal adjuster has at least one internal signal, comprising the steps of:

monitoring the at least one internal signal of the signal adjuster with an adaptation controller, the at least one internal signal being conveyed to an input to the adaptation controller to form a monitor signal;

correcting the monitor signal by addressing at least one of phase or amplitude changes that are introduced into the internal signal as it is conveyed to form the monitor signal;

generating a control signal for the signal adjuster using the corrected monitor signal.

12. A method according to claim 11, further comprising the step of determining a response of an observation filter representing the difference between the at least one internal signal and the monitor signal.

13. A method according to claim 12, wherein said adaptation controller corrects the monitor signal by dividing the monitor signal by the observation filter response.

14. A method for self-calibrating a linearizer for an amplifier, the linearizer having a signal adjuster circuit with a plurality of complex gain adjusters, and an adaptation controller, the signal input to each of the complex gain adjusters being output from the signal adjuster circuit to the adaptation controller to form a monitor signal, said method comprising the steps of:

(1) setting the amplifier to standby so its output is zero;

(2) setting a complex gain of a first complex gain adjuster to a nominal value and the other complex adjuster gains to zero;

(3) applying an input signal to the adjuster circuit, the negative output of the adjuster circuit being an error signal;

(4) bandpass correlating the error signal with the input signal to the first complex gain adjuster to generate a first correlation value;

(5) bandpass correlating the input signal to the first complex gain adjuster with itself to generate a second correlation value;

(6) computing a first observation filter response, corresponding to the first complex gain adjuster, by multiplying the nominal complex gain value by the second correlation value and by dividing by the first correlation value;

(7) repeating steps (2) through (6) to compute observation filter responses corresponding to the remaining complex gain adjusters, wherein a complex gain is set to a nominal value for each remaining complex gain adjuster, and the other complex adjuster gains are set to zero;

(8) correcting the monitor signal with a corresponding observation filter response to address at least one of phase or amplitude changes introduced into the signal input as it is output from the signal adjuster circuit to form the monitor signal.

15. A method according to claim 14, further comprising the step:

(1) correcting the monitor signal at the input of the adaptation controller by dividing them by the corresponding computed observation filter responses.

16. A method for self-calibrating a linearizer for an amplifier, the linearizer having a signal distortion adjuster circuit and a distortion adjuster circuit, the latter circuit having a plurality of complex gain adjusters, and an adaptation controller, the signal input to each of the complex gain adjusters being output from the distortion adjuster circuit to the adaptation controller to form a monitor signal, said method comprising the steps of:

(1) setting the amplifier to standby so its output is zero and setting the signal adjuster circuit to produce a non-zero value;

(2) setting a complex gain of a first complex gain adjuster to a nominal value and the other complex adjuster gains to zero;

(3) applying an input signal to the adjuster circuit so as to produce an output signal from the linearizer;

(4) bandpass correlating the output signal with the input signal to the first complex gain adjuster to generate a first correlation value;

(5) bandpass correlating the input signal to the first complex gain adjuster with itself to generate a second correlation value;

(6) computing a first observation filter response, corresponding to the first complex gain adjuster, by multiplying the nominal complex gain value by the second correlation value and by dividing by the first correlation value;

(7) repeating steps (2) through (6) to compute observation filter responses corresponding to the remaining complex gain adjusters of the distortion adjuster circuit, wherein a complex gain is set to a nominal value for each remaining complex gain adjuster, and the other complex adjuster gains are set to zero;

(8) correcting the monitor signal with a corresponding observation filter response to address at least one of phase or amplitude changes introduced into the signal input as it is output from the signal adjuster circuit to form the monitor signal.

17. A method according to claim 16, further comprising the step:
(1) correcting the monitor signal at the input of the adaptation controller by dividing them by the corresponding computed observation filter responses.

18. A controller for controlling a signal adjuster of a linearizer for an amplifier, the signal adjuster having an internal signal that is conveyed to the controller as an input to form a monitor signal, the controller comprising:
means for monitoring the internal signal and computing a difference between the internal signal, and monitor signal as it exists at an input to said controller and which is affected by at least one of phase or amplitude changes that are introduced when it is conveyed to the controller; and
means for adjusting the monitor signal based on the computed difference by addressing the at least one of phase or amplitude changes.

19. A controller according to claim 18, further comprising means to compute a control signal for the signal adjuster using the adjusted monitor signal.

* * * * *